(12) United States Patent
Kim et al.

(10) Patent No.: US 12,279,448 B2
(45) Date of Patent: Apr. 15, 2025

(54) TRENCH BOTTOM SHIELDING METHODS AND APPROACHES FOR TRENCHED SEMICONDUCTOR DEVICE STRUCTURES

(71) Applicant: Wolfspeed, Inc., Durham, NC (US)

(72) Inventors: Woongsun Kim, Cary, NC (US); Daniel J. Lichtenwalner, Raleigh, NC (US); Naeem Islam, Morrisville, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/831,599

(22) Filed: Jun. 3, 2022

(65) Prior Publication Data
US 2022/0293787 A1  Sep. 15, 2022

Related U.S. Application Data

(63) Continuation of application No. 17/018,305, filed on Sep. 11, 2020, now Pat. No. 11,355,630.

(51) Int. Cl.
*H01L 29/78* (2006.01)
*H01L 29/417* (2006.01)
(Continued)

(52) U.S. Cl.
CPC ......... *H10D 30/668* (2025.01); *H10D 30/021* (2025.01); *H10D 64/252* (2025.01); *H10D 64/518* (2025.01)

(58) Field of Classification Search
CPC ........... H01L 29/7813; H01L 29/41741; H01L 29/42376; H01L 29/7825; H01L 29/66734;
(Continued)

(56) References Cited

U.S. PATENT DOCUMENTS 6,351,018 B1   2/2002  Sapp
6,930,352 B2   8/2005  Saito et al.
(Continued)

FOREIGN PATENT DOCUMENTS

EP    1845561 A2   10/2007
EP    2565922 A1   3/2013
(Continued)

OTHER PUBLICATIONS

"International Preliminary Report on Patentability for International Patent Application No. PCTUS21049585, dated Mar. 23, 2023, 17 pages".

(Continued)

*Primary Examiner* — Khaja Ahmad
*Assistant Examiner* — Khatib A Rahman
(74) *Attorney, Agent, or Firm* — Myers Bigel, P.A.

(57) ABSTRACT

Semiconductor devices and methods of forming a semiconductor device that includes a polysilicon layer that may improve device reliability and/or a functioning of the device. An example device may include a wide band-gap semiconductor layer structure including a drift region that has a first conductivity type; a plurality of gate trenches in an upper portion of the semiconductor layer structure, each gate trench having a bottom surface, a first sidewall, a second sidewall, and an upper opening; and a plurality of polysilicon layers, each polysilicon layer on the second sidewall of a respective gate trench.

19 Claims, 22 Drawing Sheets

(51) Int. Cl.
*H01L 29/423* (2006.01)
*H01L 29/66* (2006.01)
*H10D 30/01* (2025.01)
*H10D 30/66* (2025.01)
*H10D 64/23* (2025.01)
*H10D 64/27* (2025.01)

(58) Field of Classification Search
CPC ............ H01L 29/66477; H01L 29/165; H01L 29/7397; H01L 29/407; H01L 29/2003; H01L 29/1608; H01L 29/66068; H01L 29/7806; H01L 29/4236
See application file for complete search history.

(56) References Cited

U.S. PATENT DOCUMENTS

| | | | |
|---|---|---|---|
| 7,989,882 | B2 | 8/2011 | Zhang et al. |
| 7,999,312 | B2 | 8/2011 | Takaya et al. |
| 8,232,558 | B2 | 7/2012 | Zhang et al. |
| 9,012,984 | B2 | 4/2015 | Cheng et al. |
| 9,136,372 | B2 | 9/2015 | Miyahara et al. |
| 9,293,558 | B2 | 3/2016 | Siemieniec et al. |
| 9,887,287 | B1 | 2/2018 | Lichtenwalner et al. |
| 9,954,055 | B2 * | 4/2018 | Kobayashi ............ H01L 29/404 |
| 2004/0195618 | A1 | 10/2004 | Saito et al. |
| 2010/0224932 | A1 | 9/2010 | Takaya et al. |
| 2011/0254010 | A1 * | 10/2011 | Zhang ................ H01L 29/7813 438/137 |
| 2013/0001592 | A1 | 1/2013 | Miyahara et al. |
| 2014/0077278 | A1 | 3/2014 | Nozu |
| 2014/0145206 | A1 | 5/2014 | Siemieniec et al. |
| 2014/0361349 | A1 | 12/2014 | Alexandrov et al. |
| 2015/0021623 | A1 | 1/2015 | Lichtenwalner et al. |
| 2015/0214355 | A1 * | 7/2015 | Nakano ............... H01L 29/7806 257/330 |
| 2015/0270361 | A1 | 9/2015 | Yoshimoto |
| 2015/0333175 | A1 * | 11/2015 | Kiyosawa ............ H01L 29/872 257/77 |
| 2015/0357415 | A1 | 12/2015 | Kagawa et al. |
| 2016/0005837 | A1 | 1/2016 | Cheng et al. |
| 2016/0260797 | A1 | 9/2016 | Sato et al. |
| 2017/0040425 | A1 | 2/2017 | Kueck et al. |
| 2018/0097071 | A1 | 4/2018 | Suzuki et al. |
| 2019/0088778 | A1 | 3/2019 | Kawamura |
| 2019/0348328 | A1 * | 11/2019 | Santos Rodriguez ...................... H01L 21/7813 |
| 2019/0371614 | A1 | 12/2019 | Kanazawa |
| 2020/0083368 | A1 | 3/2020 | Kobayashi et al. |
| 2021/0184009 | A1 | 6/2021 | Wang |

FOREIGN PATENT DOCUMENTS

| | | |
|---|---|---|
| EP | 2919273 A1 | 9/2015 |
| JP | 2005333068 A | 12/2005 |
| JP | 2007242852 A | 9/2007 |
| JP | 2014107571 A | 6/2014 |
| JP | 2019071313 A | 5/2019 |
| JP | 2020043242 A | 3/2020 |
| KR | 20060000346 A | 1/2006 |
| WO | 2015156024 A1 | 10/2015 |
| WO | 2020012958 A1 | 1/2020 |

OTHER PUBLICATIONS

"Notification of Transmittal of the International Search Report and the Written Opinion of the International Searching Authority, or the Declaration for corresponding International Application No. PCT/US2021/049585, mailing date: Mar. 21, 2022, (24 pages)".

"Notification of Transmittal of the International Search Report and the Written Opinion of the International Searching Authority, or the Declaration, corresponding to Application No. PCT/US2017/054212, mailing date: Nov. 28, 2017, 13 pgs".

Hiyoshi, Toru, et al., "SIC High Channel Mobility Mosfet", Sei Technical Review, No. 77, Oct. 2013, 122-126.

Kagawa, Yasuhiro, et al., "Introduction of Depletion Stopper for Reduction of JFET Resistance for 4H-SIC Trench MOSFET", Materials Science Forum, vols. 821-823, Feb. 2, 2015, 761-764.

* cited by examiner

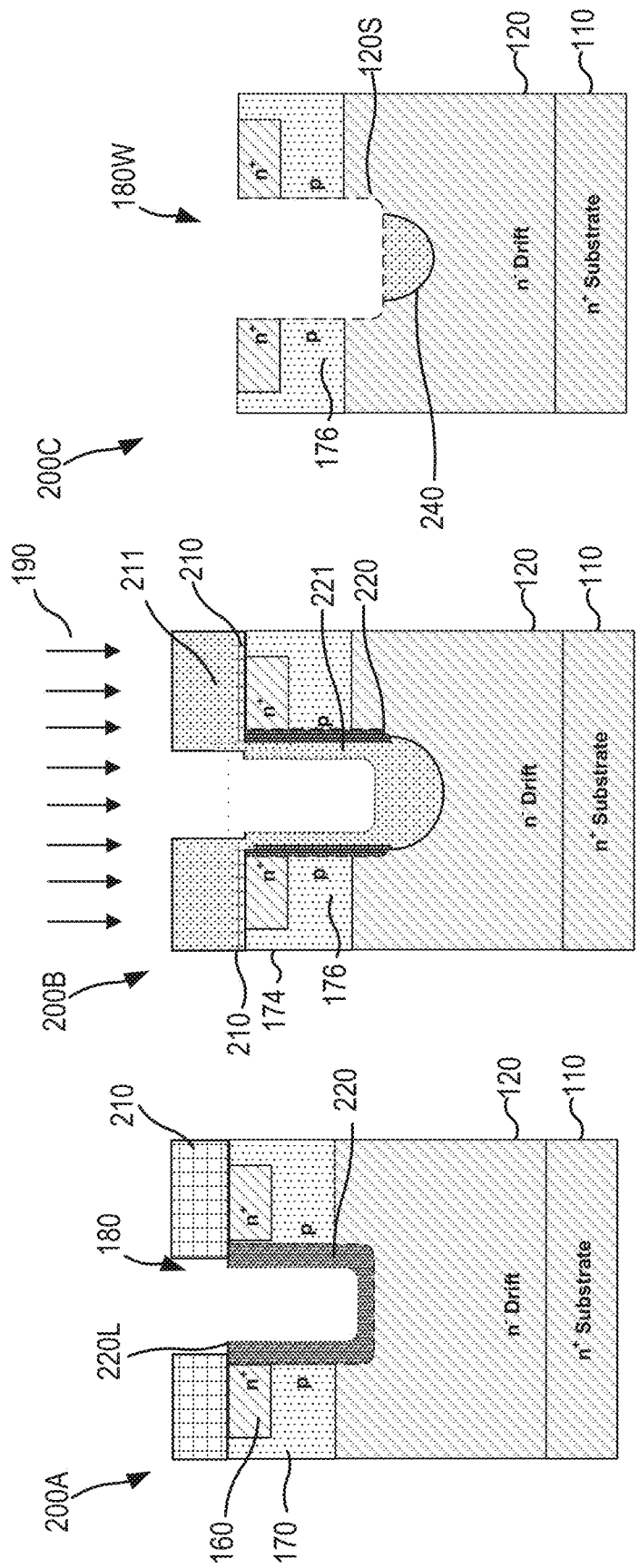

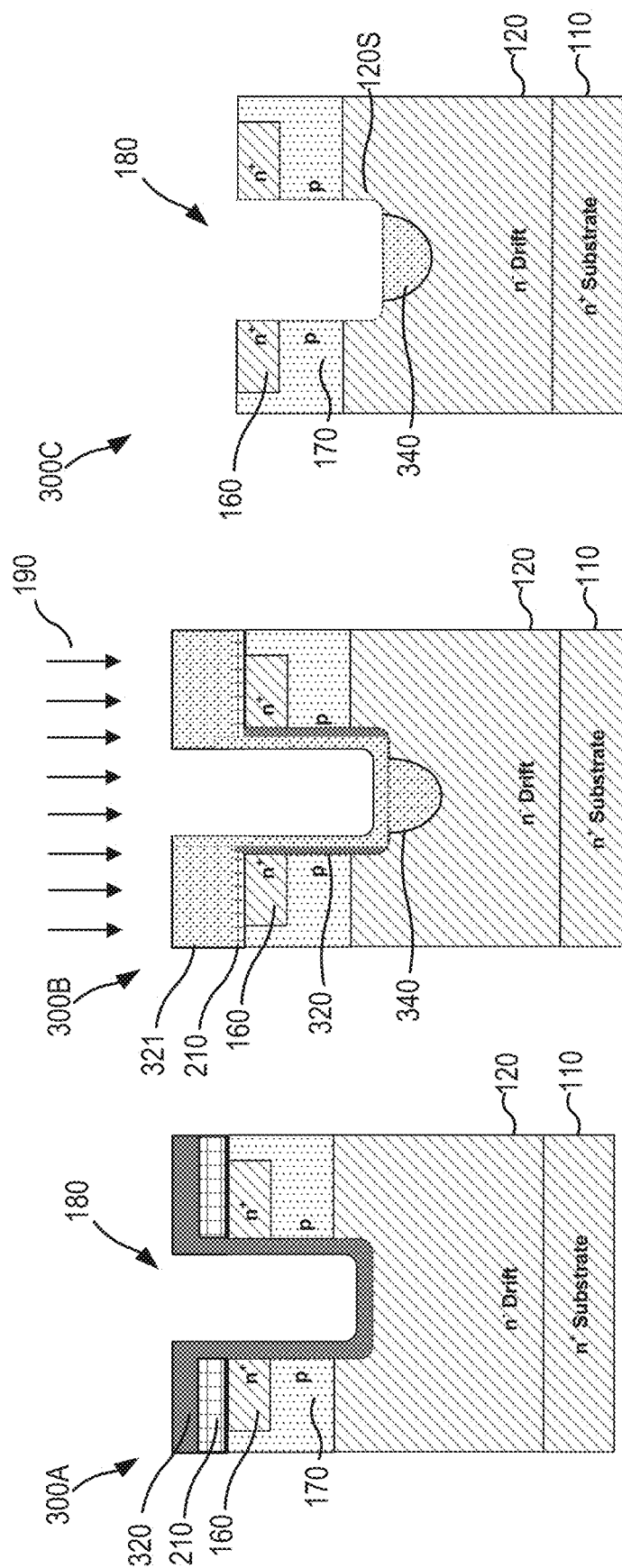

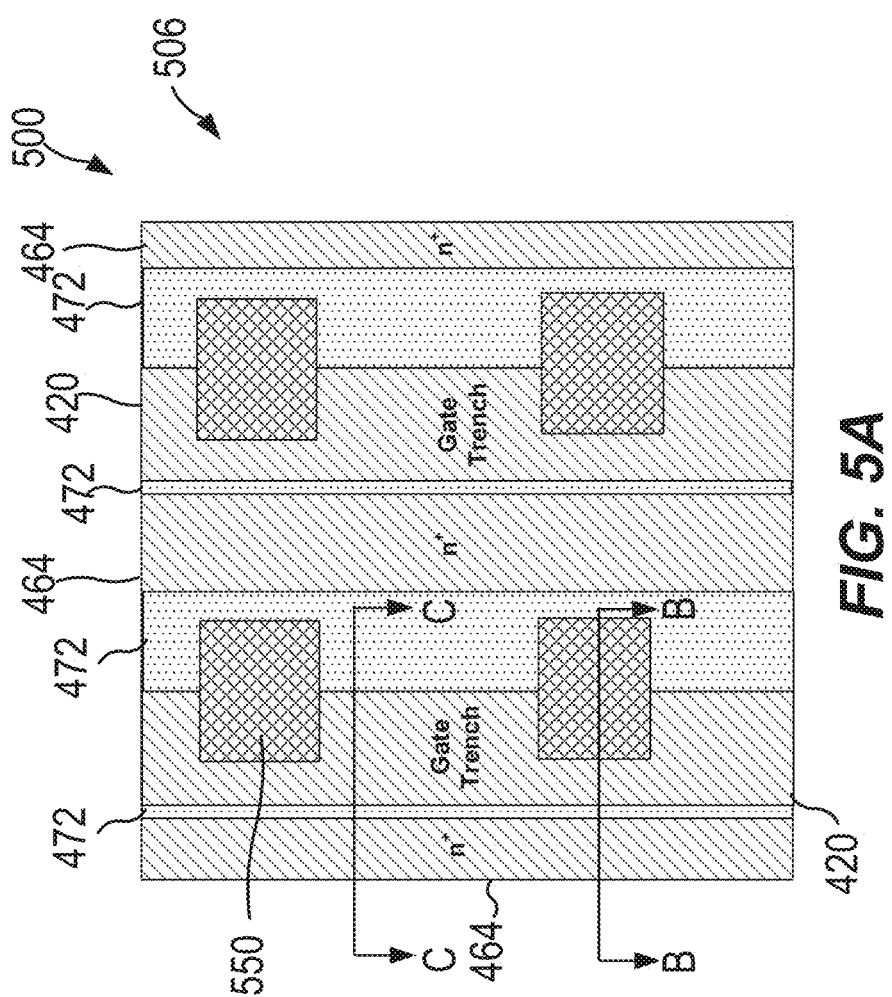

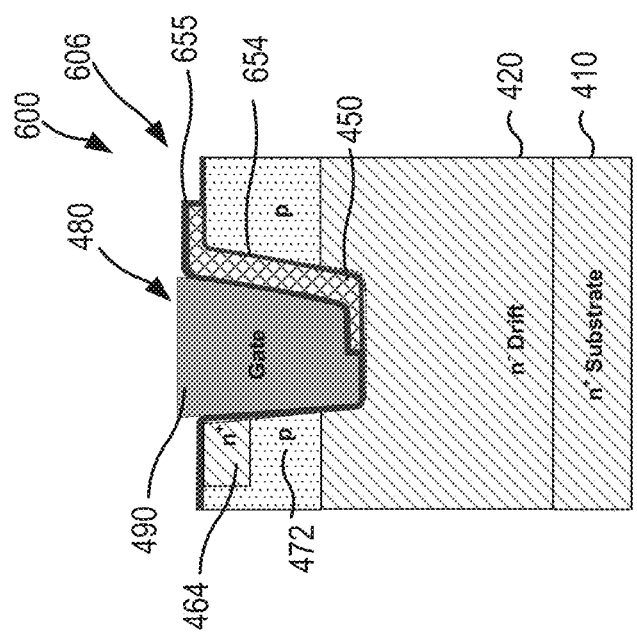
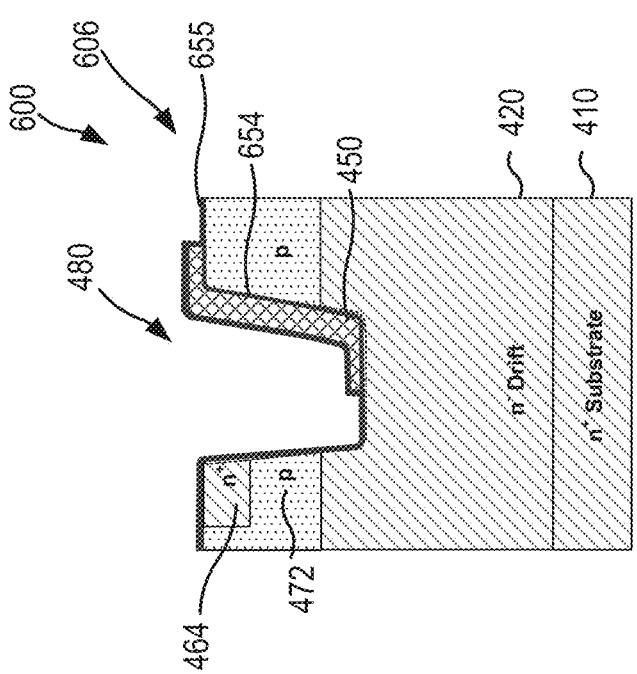
FIG. 6A
FIG. 6B

TRENCH BOTTOM SHIELDING METHODS AND APPROACHES FOR TRENCHED SEMICONDUCTOR DEVICE STRUCTURES

CROSS-REFERENCE TO RELATED APPLICATION

The present application claims priority under 35 U.S.C. § 120 as a continuation of U.S. patent application Ser. No. 17/018,305, filed Sep. 11, 2020, the entire contents of which are incorporated herein by reference.

FIELD OF THE INVENTION

The present invention relates to power semiconductor devices and, more particularly, to power semiconductor devices having gate trenches and to methods of fabricating such devices.

BACKGROUND

A Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. By way of example, an n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween. The gate electrode of a power MISFET is typically separated from the channel region by a thin gate dielectric layer In some applications, MISFETs may need to carry large currents and/or be capable of blocking high voltages. Such MISFETs are often referred to as "power" MISFETs. A wide variety of other power semiconductor devices are known in the art including, for example, bipolar junction transistors ("BJTs"), Insulated Gate Bipolar Transistors ("IGBT"), Junction Barrier Schottky diodes, Gate Turn-Off Transistors ("GTO"), MOS-controlled thyristors and various other devices. These power semiconductor devices are often fabricated from wide band-gap semiconductor materials, such as silicon carbide ("SiC") or gallium nitride ("GaN") based semiconductor materials. Herein, a wide band-gap semiconductor material refers to a semiconductor material having a band-gap greater than 1.40 eV.

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more semiconductor layers, such as semiconductor substrates and/or semiconductor epitaxial layers.

A conventional power semiconductor device typically has a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may comprise one or more separate layers) functions as a drift region of the power semiconductor device. The device typically includes an "active region," which includes one or more power semiconductor devices that have a junction such as a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

A power semiconductor device may also begin to allow non-trivial amounts of leakage current to flow at a voltage level that is lower than the designed breakdown voltage of the device. In particular, leakage current may begin to flow at the edges of the active region, where high electric fields may occur due to electric field crowding effects. In order to reduce this electric field crowding (and the resulting increased leakage currents), the above-mentioned edge terminations may be provided that surround part or all of the active region of a power semiconductor device. These edge terminations may spread the electric field out over a greater area, thereby reducing the electric field crowding.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically require a more complicated manufacturing process.

SUMMARY

According to some embodiments of the present inventive concepts, a device may be provided. The device may include a wide band-gap semiconductor layer structure including a drift region that has a first conductivity type; a plurality of gate trenches in an upper portion of the semiconductor layer structure, each gate trench having a bottom surface, a first sidewall, a second sidewall, and an upper opening; and a plurality of polysilicon layers, each polysilicon layer on the second sidewall of a respective gate trench.

In some embodiments, the device may include an oxide layer on each polysilicon layer. In some embodiments, the device may include gate structures within respective gate trenches, and each gate structure comprises a gate oxide. In some embodiments, the semiconductor layer structure comprises well regions having a second conductivity type that is different from the first conductivity type. In some embodiments, the device may include a first source/drain contact on a first major surface of the semiconductor layer structure and a second source/drain contact on a second major surface of the semiconductor layer structure opposite from the first major surface. In some embodiments, each gate trench extends in length in a direction parallel to an upper surface of the semiconductor layer structure, and each polysilicon layer extends the length of the respective gate trench. In some embodiments, each gate trench extends in length in a direction parallel to an upper surface of the semiconductor layer structure, and each gate trench comprises a first length portion comprising the respective polysilicon layer and a second length portion free of the respective polysilicon layer.

In some embodiments, the device may include channel regions in the first sidewall of the gate trenches and in the second sidewalls of the second length portions of the gate trenches. In some embodiments, the semiconductor layer structure comprises well regions having a second conductivity type that is different from the first conductivity type, and the channel regions are in the well regions. In some embodiments, each gate trench comprises a third length portion comprising a polysilicon layer on the first sidewall thereof. In some embodiments, the device may include channel regions in the first sidewall of the gate trenches. In some embodiments, the semiconductor layer structure comprises well regions having a second conductivity type that is different from the first conductivity type, and the channel regions are in the well regions. In some embodiments, the wide band-gap semiconductor comprises silicon carbide. In some embodiments, the device may include a lower oxide layer on the bottom surface, the first sidewall, and the second sidewall of each gate trench, and the polysilicon layer may be on the lower oxide layer. In some embodiments, the device may include an upper oxide layer on the polysilicon layer.

According to some embodiments of the present inventive concepts, a device may be provided. The device may include a wide band-gap semiconductor layer structure including a drift region that has a first conductivity type; a plurality of gate trenches in an upper portion of the semiconductor layer structure, each gate trench having a bottom surface, a first sidewall, a second sidewall, and an upper opening; and a plurality of polysilicon layers, each polysilicon layer below a respective gate trench of the plurality of gate trenches.

In some embodiments, the plurality of gate trenches comprises first gate trenches each having a respective polysilicon layer below the bottom surface thereof, and second gate trenches free from a polysilicon layer below the bottom surface thereof. In some embodiments, the device may include a gate structure in each second gate trench. In some embodiments, each gate trench of the device may include a respective polysilicon layer of the plurality of polysilicon layers. In some embodiments, the device may include a gate structure in each gate trench. In some embodiments, each gate trench extends in length in a direction parallel to an upper surface of the semiconductor layer structure, and each polysilicon layer extends the length of the respective gate trench. In some embodiments, each gate trench extends in length in a direction parallel to an upper surface of the semiconductor layer structure, and each gate trench comprises a first length portion comprising the respective polysilicon layer and a second length portion free of the respective polysilicon layer. In some embodiments, the device may include channel regions in the first sidewall of the gate trenches and in the second sidewalls of the second length portions of the gate trenches. In some embodiments, the semiconductor layer structure comprises well regions having a second conductivity type that is different from the first conductivity type, and the channel regions are in the well regions. In some embodiments, the device may include an oxide layer on each polysilicon layer. In some embodiments, the semiconductor layer structure comprises well regions having a second conductivity type that is different from the first conductivity type. In some embodiments, the device may include a first source/drain contact on a first major surface of the semiconductor layer structure and a second source/drain contact on a second major surface of the semiconductor layer structure opposite from the first major surface. In some embodiments, the device may include comprising a channel region in the first sidewall of each gate trench. In some embodiments, the semiconductor layer structure comprises a well region having a second conductivity type that is different from the first conductivity type, and the channel region is in the well region. In some embodiments, the wide band-gap semiconductor comprises silicon carbide.

According to some embodiments of the present inventive concepts, a device may be provided. The device may include a wide band-gap semiconductor layer structure including a drift region that has a first conductivity type; a plurality of gate trenches in an upper portion of the semiconductor layer structure, each gate trench having a bottom surface, a first sidewall, a second sidewall, and an upper opening, each gate trench comprising a plurality of first length portions and a plurality of second length portions alternating along a length of the gate trench; and a plurality of polysilicon layers, each polysilicon layer on the second sidewall of a respective gate trench in the first length portions. The second length portions of each gate trench may be free from the polysilicon layers.

In some embodiments, the device may include an oxide layer within each gate trench. In some embodiments, the oxide layer comprises a first cross-section in the first length portions of each gate trench and a second cross-section in the second length portions of each gate trench. In some embodiments, the device may include a gate structure within respective gate trenches, where the gate structure comprises a gate electrode. In some embodiments, the gate electrode comprises a first cross-section in the first length portions of each gate trench and a second cross-section in the second length portions of each gate trench. In some embodiments, the semiconductor layer structure comprises well regions having a second conductivity type that is different from the first conductivity type. In some embodiments, the device may include a first source/drain contact on a first major surface of the semiconductor layer structure and a second source/drain contact on a second major surface of the semiconductor layer structure opposite from the first major surface. In some embodiments, the wide band-gap semiconductor comprises silicon carbide.

According to some embodiments of the present inventive concepts, a device may be provided. The device may include a wide band-gap semiconductor layer structure including a drift region that has a first conductivity type; a plurality of gate trenches in an upper portion of the semiconductor layer structure, each gate trench having a bottom surface, a first sidewall, a second sidewall, and an upper opening, and the plurality of gate trenches comprising first and second gate trenches; a plurality of polysilicon layers, each polysilicon layer below a respective first gate trench of the plurality of gate trenches; a plurality of gate electrodes, each gate electrode arranged within a respective second gate trench of the plurality of gate trenches. The second length portions of each gate trench may be free from the polysilicon layers.

In some embodiments, each gate trench extends in length in a direction parallel to an upper surface of the semiconductor layer structure, and each polysilicon layer extends the length of the respective first gate trench. In some embodiments, each gate trench extends in length in a direction parallel to an upper surface of the semiconductor layer structure. In some embodiments, the device may include channel regions in the first sidewall of the second gate trenches. In some embodiments, the semiconductor layer structure comprises well regions having a second conductivity type that is different from the first conductivity type, and the channel regions may be in the well regions. In some embodiments, the wide band-gap semiconductor comprises silicon carbide.

According to some embodiments of the present inventive concepts, a method of forming a semiconductor device is provided. The method may include forming a wide band-gap semiconductor layer structure on a substrate, the semiconductor layer structure including a drift region that has a first conductivity type; forming a plurality of gate trenches in an upper portion of the semiconductor layer structure, the gate trenches spaced apart from each other, each gate trench having a bottom surface, a first sidewall, a second sidewall, and an upper opening; and forming a polysilicon layer along the second sidewall of each gate trench.

In some embodiments, the method may include forming an oxide layer on the polysilicon layer. In some embodiments, the method may include forming a lower oxide layer on the bottom surface, the first sidewall, and the second sidewall of each gate trench, where forming the polysilicon layer comprises forming the polysilicon layer on the lower oxide layer. In some embodiments, the method may include forming an upper oxide layer on the polysilicon layer. In some embodiments, the method may include forming gate structures within respective gate trenches, where each gate structure comprises a gate electrode. In some embodiments, the semiconductor layer structure comprises well regions having a second conductivity type that is different from the first conductivity type. In some embodiments, the method may include forming a first source/drain contact on a first major surface of the semiconductor layer structure and a second source/drain contact on a second major surface of the semiconductor layer structure opposite from the first major surface. In some embodiments, each gate trench extends in length in a direction parallel to an upper surface of the semiconductor layer structure, and each polysilicon layer extends the length of the respective gate trench. In some embodiments, each gate trench extends in length in a direction parallel to an upper surface of the semiconductor layer structure, and each gate trench comprises a first length portion comprising the respective polysilicon layer and a second length portion free of the respective polysilicon layer. In some embodiments, channel regions are formed in the first sidewall of the gate trenches and in the second sidewalls of the second length portions of the gate trenches. In some embodiments, the semiconductor layer structure comprises well regions having a second conductivity type that is different from the first conductivity type, and the channel regions may be in the well regions. In some embodiments, channel regions are formed in the first sidewall of the gate trenches. In some embodiments, the semiconductor layer structure comprises well regions having a second conductivity type that is different from the first conductivity type, and the channel regions may be in the well regions. In some embodiments, the wide band-gap semiconductor comprises silicon carbide.

According to some embodiments of the present disclosure, a method of forming a semiconductor device may be provided. The method may include forming a wide band-gap semiconductor layer structure on a substrate, the semiconductor layer structure including a drift region that has a first conductivity type; forming a plurality of gate trenches in an upper portion of the semiconductor layer structure, the gate trenches spaced apart from each other, each gate trench having a bottom surface, a first sidewall, a second sidewall, and an upper opening; and forming a polysilicon layer at the bottom of at least some of the gate trenches.

In some embodiments, the plurality of gate trenches comprises first gate trenches each having a respective polysilicon layer on the bottom surface thereof, and second gate trenches free from a polysilicon layer on the bottom surface thereof. In some embodiments, the method may include further comprising forming a gate structure in each second gate trench. In some embodiments, a polysilicon layer is formed in each gate trench of the semiconductor device. In some embodiments, the method may include forming a gate structure in each gate trench. In some embodiments, each gate trench extends in length in a direction parallel to an upper surface of the semiconductor layer structure, and each polysilicon layer extends the length of the respective gate trench. In some embodiments, each gate trench extends in length in a direction parallel to an upper surface of the semiconductor layer structure, and each gate trench comprises a first length portion comprising the respective polysilicon layer and a second length portion free of the respective polysilicon layer. In some embodiments, the method may include forming an oxide layer on each polysilicon layer. In some embodiments, the method may include forming a first source/drain contact on a first major surface of the semiconductor layer structure and a second source/drain contact on a second major surface of the semiconductor layer structure opposite from the first major surface. In some embodiments, the wide band-gap semiconductor comprises silicon carbide According to some embodiments of the present disclosure, a method of forming a semiconductor device may be provided. The method may include forming a wide band-gap semiconductor layer structure on a substrate, the semiconductor layer structure including a drift region that has a first conductivity type; forming a plurality of gate trenches in an upper portion of the semiconductor layer structure, each gate trench having a bottom surface, a first sidewall, a second sidewall, and an upper opening, each gate trench comprising a plurality of first length portions and a plurality of second length portions alternating along a length of the gate trench; and forming a plurality of polysilicon layers, each polysilicon layer on the second sidewall of a respective gate trench in the first length portions. The second length portions of each gate trench may be free from the polysilicon layers.

In some embodiments, the method may include forming an oxide layer within each gate trench. In some embodiments, the oxide layer comprises a first cross-section in the first length portions of each gate trench and a second cross-section in the second length portions of each gate trench. In some embodiments, the method may include forming a gate structure within respective gate trenches, where the gate structure comprises a gate electrode. In some embodiments, the gate electrode comprises a first cross-section in the first length portions of each gate trench and a second cross-section in the second length portions of each gate trench. In some embodiments, the semiconductor layer structure comprises well regions having a second conductivity type that is different from the first conductivity type. In some embodiments, the method may include forming a first source/drain contact on a first major surface of the semiconductor layer structure and a second source/drain contact on a second major surface of the semiconductor layer structure opposite from the first major surface. In some embodiments, the wide band-gap semiconductor comprises silicon carbide.

According to some embodiments of the present disclosure, a device is provided. The device may include a wide band-gap semiconductor layer structure including a drift region that has a first conductivity type; a plurality of source trenches in an upper portion of the semiconductor layer structure, each source trench having a bottom surface, a first sidewall, a second sidewall, and an upper opening; a plurality of gate trenches in an upper portion of the semiconductor layer structure, each gate trench having a bottom surface, a first sidewall, a second sidewall, and an upper opening; and a plurality of polysilicon layers, each polysilicon layer below a respective source trench of the plurality of source trenches.

In some embodiments, the plurality of source trenches comprises first source trenches each having a respective polysilicon layer below the bottom surface thereof, and wherein each gate trench is free from a polysilicon layer below the bottom surface thereof. In some embodiments, the device may include a gate structure in each gate trench. In some embodiments, each gate trench and each source trench extends in length in a direction parallel to an upper surface of the semiconductor layer structure, and each polysilicon layer extends the length of the respective source trench. In some embodiments, the device may include channel regions in the first and second sidewalls of each gate trench. In some embodiments, the semiconductor layer structure comprises well regions having a second conductivity type that is different from the first conductivity type, and the channel regions are in the well regions. In some embodiments, the device may include a first source/drain contact on a first major surface of the semiconductor layer structure and a second source/drain contact on a second major surface of the semiconductor layer structure opposite from the first major surface.

According to some embodiments of the present disclosure, a device is provided. The device may include wide band-gap semiconductor layer structure including a drift region that has a first conductivity type; a plurality of gate trenches in an upper portion of the semiconductor layer structure, each gate trench having a bottom surface, a first sidewall, a second sidewall, and an upper opening, each gate trench comprising a plurality of first length portions, a plurality of second length portions, and a plurality of third length portions; a plurality of first polysilicon layers, each first polysilicon layer on the first sidewall of a respective gate trench in the first length portions; and a plurality of second polysilicon layers, each second polysilicon layer on the second sidewall of a respective gate trench in the second length portions. The first and second sidewalls of each gate trench in the third length portions may be free from the first and second polysilicon layers.

In some embodiments, the device may include an oxide layer within each gate trench. The oxide layer may have a first cross-section in the first length portions of each gate trench, a second cross-section in the second length portions of each gate trench, and a third cross-section in the third length portions of each gate trench. In some embodiments, the device may include a gate structure within respective gate trenches, where the gate structure comprises a gate electrode. The gate electrode may have a first cross-section in the first length portions of each gate trench, a second cross-section in the second length portions of each gate trench, and a third cross-section in the third length portions of each gate trench. In some embodiments, the semiconductor layer structure comprises well regions having a second conductivity type that is different from the first conductivity type. In some embodiments, the device may include a first source/drain contact on a first major surface of the semiconductor layer structure and a second source/drain contact on a second major surface of the semiconductor layer structure opposite from the first major surface. In some embodiments, the wide band-gap semiconductor comprises silicon carbide.

According to some embodiments of the present disclosure, a device is provided. The device may include a wide band-gap semiconductor layer structure including a drift region that has a first conductivity type; a plurality of gate trenches in an upper portion of the semiconductor layer structure, each gate trench having a bottom surface, a first sidewall, a second sidewall, and an upper opening, each gate trench comprising a plurality of first length portions and a plurality of second length portions; and a plurality of polysilicon layers, each first polysilicon layer on the first and second sidewalls of a respective gate trench in the first length portions. The first and second sidewalls of each gate trench in the second length portions may be free from the polysilicon layers.

In some embodiments, the device may include an oxide layer within each gate trench. The oxide layer may have a first cross-section in the first length portions of each gate trench and a second cross-section in the second length portions of each gate trench. In some embodiments, the device may include a gate structure within respective gate trenches, where the gate structure comprises a gate electrode. The gate electrode may have a first cross-section in the first length portions of each gate trench, and a second cross-section in the second length portions of each gate trench. In some embodiments, the semiconductor layer structure comprises well regions having a second conductivity type that is different from the first conductivity type. In some embodiments, the device may include a first source/drain contact on a first major surface of the semiconductor layer structure and a second source/drain contact on a second major surface of the semiconductor layer structure opposite from the first major surface. In some embodiments, the wide band-gap semiconductor comprises silicon carbide.

According to some embodiments of the present disclosure, a device is provided. The device may include a wide band-gap semiconductor layer structure including a drift region that has a first conductivity type; plurality of gate trenches in an upper portion of the semiconductor layer structure, each gate trench having a bottom surface, a first sidewall, a second sidewall, and an upper opening, and each gate trench exposing side surfaces of the drift region; and a plurality of polysilicon layers, each polysilicon layer on at least portions of the first and second sidewalls of a respective gate trench.

In some embodiments, the device may include an oxide layer within each gate trench. In some embodiments, the device may include a gate structure within respective gate trenches, wherein the gate structure comprises a gate electrode. In some embodiments, the semiconductor layer structure comprises well regions having a second conductivity type that is different from the first conductivity type. In some embodiments, the device may include a first source/drain contact on a first major surface of the semiconductor layer structure and a second source/drain contact on a second major surface of the semiconductor layer structure opposite from the first major surface. In some embodiments, the wide band-gap semiconductor comprises silicon carbide.

BRIEF DESCRIPTION OF THE DRAWINGS

FIGS. 2A-2C are schematic cross-sectional diagram of a first related art approach addressing issues presented by the gate trench power MOSFET of FIG. 1B.

FIGS. 3A-3C are schematic cross-sectional diagram of a second related art approach addressing issues presented by the gate trench power MOSFET of FIG. 1B.

FIGS. 5A-5G are schematic diagrams illustrating a gate trench power MOSFET according to embodiments of the present inventive concepts.

FIGS. 6A-6D are schematic diagrams illustrating a gate trench power MOSFET according to embodiments of the present inventive concepts.

DETAILED DESCRIPTION

In most cases, MISFETs include gate dielectric layers that are formed as an oxide layer (e.g., a silicon oxide layer). A MISFET that has an oxide gate dielectric layer is referred to as a Metal Oxide Semiconductor Field Effect Transistor or "MOSFET." As will be discussed in further detail below, the oxide gate dielectric layers in these devices may be susceptible to damage when subjected to high electric fields. Power MOSFETs (and other power semiconductor devices) that include gate trenches thus often have shielding regions that are formed beneath the gate trenches that help reduce the electric field levels in the oxide gate dielectric layers during reverse blocking operation. As oxide gate dielectric layers are almost always used due to their superior electrical properties, the discussion of embodiments of the present invention below will focus on MOSFETs as opposed to MISFETs, but it will be appreciated that the techniques according to embodiments of the present invention that are described herein are equally applicable to devices having gate dielectric layers formed with materials other than oxides.

SiC gate trench MOSFET vertical power devices are attractive due to their inherent lower specific on-resistance, which may result in more efficient operation for power switching operations requiring low-to-moderate reverse blocking voltage levels (e.g., 650-1200V). Trench MOSFET vertical power devices may exhibit a lower specific resistance during on-state operation since the channel is formed on the sidewall of the gate trench, and the trench design reduces the overall pitch of the device, allowing for increased integration. Moreover, the carrier mobility in the sidewall channel of a trench MOSFET has been found to be 2-4 times higher than the corresponding carrier mobility in the channel of a planar (e.g., lateral structure) device. This increased carrier mobility also enhances the current density. However, SiC gate trench MOSFET vertical power devices may experience oxide reliability issues, due to the presence of sharp high-field corners at bottom edges of the trench that can break down the gate oxide over time, eventually resulting in failure of the device.

Figure 1A:
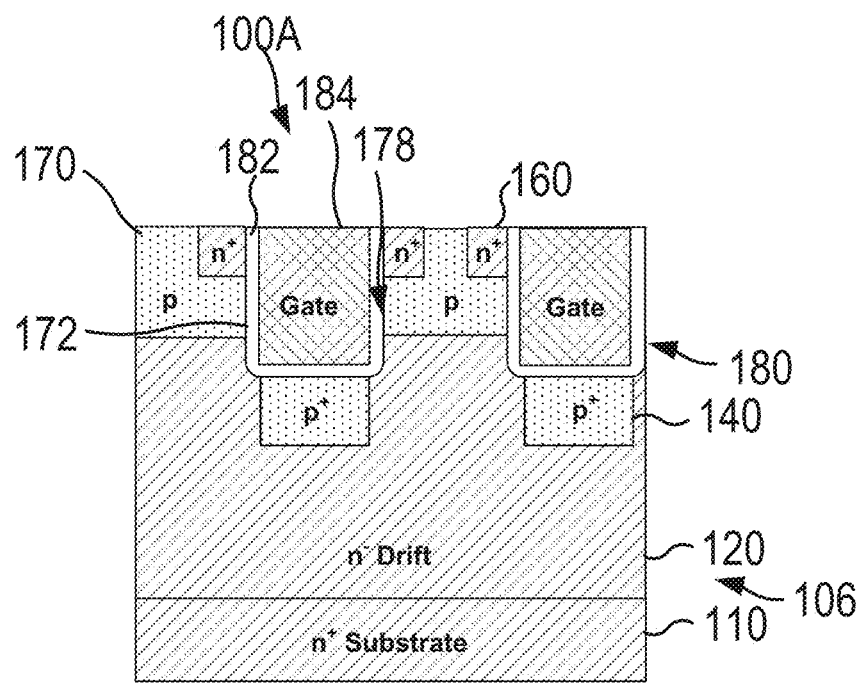
FIG. 1A is a schematic cross-sectional diagram of a gate trench power MOSFET showing an ideal gate trench and implant shield.

FIG. 1A is a schematic cross-sectional diagram of a first wide band-gap power MOSFET 100A. As shown in FIG. 1A, the power MOSFET 100A includes a heavily-doped (n$^+$) n-type silicon carbide substrate 110. A lightly-doped (n$^-$) silicon carbide drift region 120 is provided on the substrate 110. A moderately-doped p-type silicon carbide layer 170 is formed on the upper surface of the n-type drift region 120. The moderately-doped p-type silicon carbide layer 170 may be formed, for example, by epitaxial growth. This moderately-doped p-type silicon carbide layer 170 may provide p-wells 172 for the device 100. The transistor channels may be formed in the p-wells 172, as will be discussed below. A heavily-doped n$^+$ silicon carbide source layer 160 may be formed in an upper region of the p-type silicon carbide layer 170. The heavily-doped n⁺ silicon carbide source layer 160 may be formed for example, by ion implantation.

The substrate 110, drift region 120, the moderately doped p-type layer 170, and the heavily-doped n⁺ silicon carbide source layer 160, along with the various regions/patterns formed therein, comprise a semiconductor layer structure 106 of the MOSFET 100A.

Gate trenches 180 are formed in the semiconductor layer structure 106. The gate trenches 180 may extend through the heavily-doped n⁺ silicon carbide source layer 160 and the moderately-doped p-type layer 170 and into the drift region 120. A gate insulating layer 182 may be formed on the bottom surface and sidewalls of each gate trench 180. A gate electrode 184 may be formed on each gate insulating layer 182 to fill the respective gate trenches 180. Vertical channel regions 178 are provided in the p-wells 172 adjacent the gate insulating layer 182.

Source contacts (not shown) may be formed on the heavily-doped n-type source regions 160. A drain contact (not shown) may be formed on the lower surface of the substrate 110. A gate contact (not shown) may be formed on the gate electrode 184.

If the gate insulating layer 182, which is typically implemented as a silicon oxide layer, is subjected to overly high electric fields, the gate insulating layer 182 can degrade over time and eventually fail to insulate the gate electrode 184 from the semiconductor layer structure, which can result in device failure. The corners of the gate insulating layer 182 (e.g., the areas where the gate insulating layer 182 transition from vertical surfaces to lateral surfaces) are particularly susceptible to such high electric fields. To improve reliability of the gate insulating layer 182, the power MOSFET 100 includes a deep shielding pattern 140 under the gate trench 180. The deep shielding pattern 140 may be a heavily-doped (p⁺) silicon carbide pattern that is formed in the upper surface of the n-type drift region 120 by ion implantation.

The deep shielding pattern 140 may be very effective in protecting the corners of the gate insulating layer 182 from high electric fields during reverse blocking operation. The deep shielding pattern 140 may provide shielding for the gate insulating layer 182, and may provide desired device performance resulting from utilization of two sidewall faces for current conduction.

The deep shielding pattern 140 of power MOSFET 100A may be formed subsequent to formation of the gate trench 180 and prior to formation of the gate insulating layer 182 and the gate electrode 184 therein. Ion implantation may be used to form the deep shielding patterns 140. The depth at which the ions are implanted is directly related to the energy of the implant, i.e., ions implanted into a semiconductor layer at higher energies tend to go deeper into the layer. Thus, forming the deep shielding patterns (which may have a thickness of 1-5 microns) via ion implantation requires high energy implants.

When dopant ions are implanted into a semiconductor layer, the ions damage the crystal lattice of the semiconductor layer, and this damage typically can only be partly repaired by thermal annealing. Moreover, the amount of lattice damage is also directly related to the implant energy, with higher energy implants tending to cause more lattice damage than lower energy implants, and the uniformity of the ion implant also tends to decrease with increasing implant depth. Thus, to form implanted regions that have good doping uniformity by depth and/or acceptable levels of lattice damage, it may be necessary to perform a multiple successive epitaxial growth/ion implantation steps to form a deep implant. This may significantly increase the complexity and cost of the manufacturing process and may not be a commercially viable option in many instances.

Figure 1B:
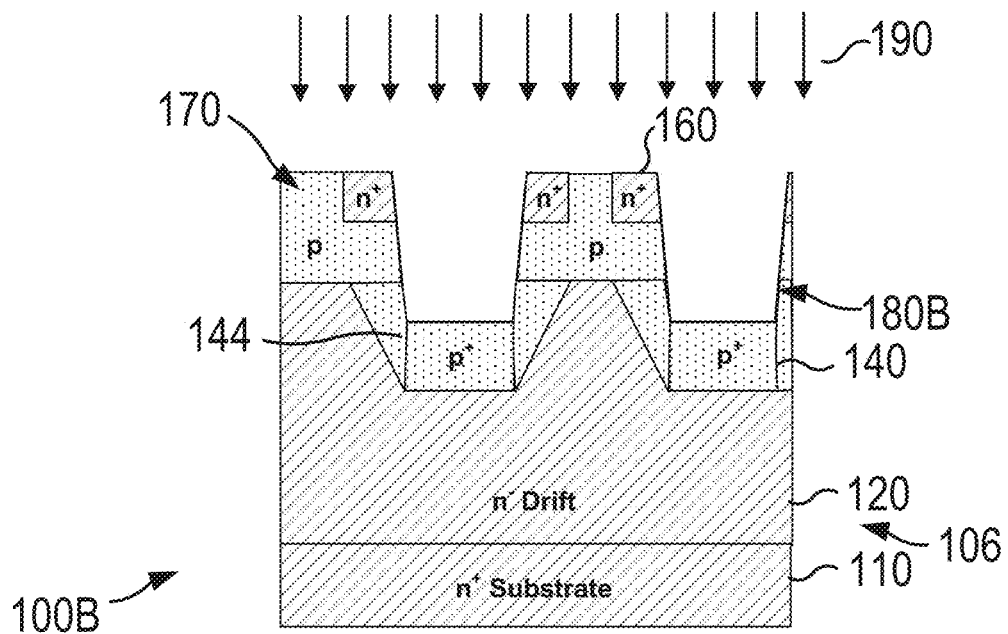
FIG. 1B is a schematic cross-sectional diagram of a gate trench power MOSFET showing a gate trench and implant shield that may result in an exposed channel and drift region.

Moreover, formation of the deep shielding pattern 140 may be challenging, due to anisotropic etching of the silicon carbide layers 160, 170 and 120 during formation of the gate trench 180. Where FIG. 1A illustrates an ideal trench 180 and deep shielding pattern 140, FIG. 1B is a schematic cross-sectional view of a power MOSFET 100B during formation of the deep shielding pattern 140 via ion implantation 190 that may result from current formation techniques. As can be seen, the sidewalls of the trench 180B are angled (i.e., not vertical) due to the anisotropic etching. Because of the angling and the side walls and ion scattering effects, p-type ions will be implanted into the semiconductor regions forming the sidewalls of the gate trench 180 during formation of the p⁺ deep shielding pattern 140. The implantation of p-type ions into these regions of the device changes the effective doping level of these regions. Moreover, as the drift region 120 is a lightly-doped (n⁻) region (e.g., orders of magnitude lower than the heavily-doped (p⁺) deep shielding pattern 140), the n-type dopants in the upper portions of the drift region 120 may be at least partially compensated by the unintended doping of p-type dopants into the trench sidewalls that can occur during the ion implantation step used to form the deep shielding pattern 140. This can result in an increase in the JEFT resistance (since the effective n-type doping level is reduced by the implantation of compensating p-type ions) and, in some cases, as shown in FIG. 1B, the p-type dopants may completely overwhelm the background n-type doping of the drift region 120 so that p-type pinch regions 144 are formed which connect the heavily-doped (p⁺) deep shielding pattern 140 to the moderately-doped p-type layer 170. If this occurs, the current flow is pinched off, rendering power MOSFET 100B unusable or severely degraded in performance.

Present approaches to ensure that the sidewalls of drift region 120 that are exposed by the trench 180 between the p-well 172 and the deep shielding pattern 140 are not unintentionally doped with p-type dopants during formation of the deep shielding pattern 140 are described below with reference to FIGS. 2A-3C. FIGS. 2A-2C illustrate operations 200A through 200C, respectively, of a first related art approach of forming a power MOSFET that addresses the issues presented by the gate trench power MOSFET of FIG. 1B. Prior to operation 200A illustrated in FIG. 2A, a trench etch oxide mask 210 may be formed on upper surfaces of the device, and the gate trench 180 may be formed by etching. In operation 200A of FIG. 2A, and with the trench etch oxide mask 210 still present, a sidewall oxide mask 220 may be formed by oxidizing portions of the heavily-doped n⁺ silicon carbide source layer 160, the moderately-doped p-type layer 170, and the lightly-doped n⁻ silicon carbide drift region 120 that are exposed by the gate trench 180. This sidewall oxide mask may be formed by thermal oxidation.

In operation 200B illustrated in FIG. 2B, ion implantation 190 may be performed to implant the heavily-doped (p⁺) silicon carbide deep shielding pattern 240 within the portion of the lightly-doped n⁻ silicon carbide drift region 120 that is exposed at the bottom of the trench 180. The ion implantation 190 may also be performed on the exposed surfaces of the trench etch oxide mask 210 and the sidewall oxide mask 220, resulting in a portion 211 of the trench etch oxide mask 210 and a portion 221 of the sidewall oxide mask 220 being implanted with p-type dopants.

In operation 200C illustrated in FIG. 2C, the oxide masks 210 and 220 may be stripped, along with the portions 211 and 221, respectively, that were subjected to ion implantation in operation 200B. The removal of the oxide masks 210 and 220 ensures that the portions 120S of the lightly-doped n⁻ silicon carbide drift region 120 that are exposed by the trench are not substantially counter-doped with p-type dopants, and thus the problems of power MOSFET 100B of FIG. 1B may be avoided.

One advantage of the approach of FIGS. 2A-2C is that when the device is formed on a SiC wafer having the (0001) face exposed, crystal orientation effects will cause the sidewall oxide mask 220 to form much more quickly than the oxide that forms on the portion of the drift region 120 that is exposed at the bottom of the gate trench 180. On the other hand, disadvantages of the approach of FIGS. 2A-2C are that the resultant gate trench 180W that is formed subsequent to operation 200C is wider and deeper than the original gate trench 180 formed prior to operation 200A in FIG. 2A. As a result, a width of the deep shielding pattern 240 is less than a width of the gate trench 180, which means that the deep shielding pattern 240 will not extend to cover the bottom corners of a gate insulating layer that is subsequently formed in the gate trench 180W, and hence the deep shielding pattern provides less protection to the most vulnerable portion of the gate insulating layer. Also, the formation of sidewall oxide mask 220 in operation 200A may result in ledge surfaces 220L (see FIG. 2A) which in operation 200B may scatter implants in unintended directions resulting, for example, in heavier p-type doping of the channel regions (which requires thicker sidewall oxide masks 220, further widening the resultant gate trench 180W).

FIGS. 3A-3C illustrate a second related art approach of a method of forming a power MOSFET that addresses issues presented by the gate trench power MOSFET of FIG. 1B. Prior to operation 300A illustrated in FIG. 3A, a trench etch oxide mask 210 is formed on upper surfaces of heavily-doped n⁺ silicon carbide source layer 160 and moderately-doped p-type layer 170, and the gate trench 180 is formed by etching. In operation 300A of FIG. 3A, and with the trench etch oxide mask 210 still present, a sidewall oxide mask 320 may be formed by depositing a mask material (e.g., SiO₂) on the portions of the heavily-doped n⁺ silicon carbide source layer 160, the moderately-doped p-type layer 170, and the lightly-doped n⁻ silicon carbide drift region 120 that are exposed by the gate trench 180 and on the upper surfaces of trench etch oxide mask 210.

In operation 300B illustrated in FIG. 3B, ion implantation 190 may be performed to implant the heavily-doped (p⁺) silicon carbide deep shielding pattern 340 within the lightly-doped n⁻ silicon carbide drift region 120. The ion implantation 190 may also be performed on the exposed surfaces of the trench etch oxide mask 210 and the sidewall oxide mask 320, resulting in a portion of the trench etch oxide mask 210 and a portion 321 of the sidewall oxide mask 220 being implanted with ions.

In operation 300C illustrated in FIG. 3C, the oxide masks 210 and 320 may be stripped, along with the portions thereof that were subjected to ion implantation in operation 300B. As with the operations of FIGS. 2A-2C, the removal of the oxide masks 210 and 320 results in portions 120S of the lightly-doped n⁻ silicon carbide drift region 120 that are substantially unaffected by the heavily-doped (p⁺) silicon carbide deep shielding pattern 340, and thus the problems of power MOSFET 100B of FIG. 1B may be avoided.

The approach of FIGS. 3A-3C provide an advantage in that the resultant gate trench subsequent to operation 300C of FIG. 3C has the same width as the original gate trench 180 etched prior to operation 300A of FIG. 3A, because, unlike operations 200A-C, no material of the drift region 120, the p-type layer 170, and the source layer 160 is thermally oxidized. Ledge surfaces similar to surfaces 200L are also advantageously avoided. However, a disadvantage of the approach of FIGS. 3A-3C is that deposition of the sidewall mask material to form sidewall oxide mask 320 may result in a thicker mask applied to the bottom of the gate trench 180 (e.g., on the upper surface of the drift region 120 exposed by the gate trench 180) than along the sidewalls of the gate trench 180. This thicker mask in the bottom of gate trench 180 may block implantation of the ions used to form the heavily-doped (p⁺) silicon carbide deep shielding pattern 340 to a potentially unacceptable degree. Thinning the sidewall oxide mask 320 (e.g., by depositing less material), on the other hand, may potentially require a re-etch of the gate trench 180 to remove implanted material in the sidewalls of the drift region 120, the p-type layer 170, and the source layer 160, again resulting in a wider and deeper gate trench than the original gate trench 180 formed prior to operation 300A in FIG. 3A.

As discussed above, the formation of the deep shielding region may be time-consuming, and may result in implantation damage to the semiconductor device structure. Pursuant to embodiments of the present invention, gate trench wide band-gap power semiconductor devices such as power MOSFETs and power IGBTs are provided that lack deep trench shielding patterns underneath the gate trenches. Instead, a doped polysilicon material may be used as a shielding material to shield a portion of a bottom of the gate trenches and portions of one sidewall of the gate trenches. Using highly doped polysilicon as the blocking material may simplify operations of forming the gate trench wide band-gap power semiconductor devices, and may reduce the implantation damage to the device. As such, the example embodiments of the present disclose may reduce or avoid the disadvantages of the approaches of FIGS. 1B, 2A-C and 3A-C. Additionally, in some embodiments the doped polysilicon region may be connected to the source of the power semiconductor device, which may be advantageous when the device is in the blocking mode of operation.

The new approaches for forming doped polysilicon blocking regions may reduce or even eliminate implanted p-type dopants in portions of the drift region that are between the p-well channel and the deep shielding pattern. Thus, the devices according to embodiments of the present invention may exhibit increased performance as compared to devices formed using the technique discussed above with respect to the power MOSFET 100B of FIG. 1B. Moreover, the approaches according to embodiments of the present invention may avoid wider and/or deeper gate trenches as in FIGS. 2A-C, or the difficulties in forming the deep shielding pattern that occur as in FIGS. 3A-C.

Embodiments of the present invention will now be described with reference to FIGS. 4A-13. It will be appreciated that features of the different embodiments disclosed herein may be combined in any way to provide many additional embodiments. Thus, for example, features of any MOSFET embodiment described herein may be incorporated into IGBT embodiments, and vice versa. Thus, it will be appreciated that various features of the inventive concepts are described below with respect to specific examples, but that these features may be added to other embodiments and/or used in place of example features of other embodiments to provide many additional embodiments. Thus, the present invention should be understood to encompass these different combinations.

Figure 4A:
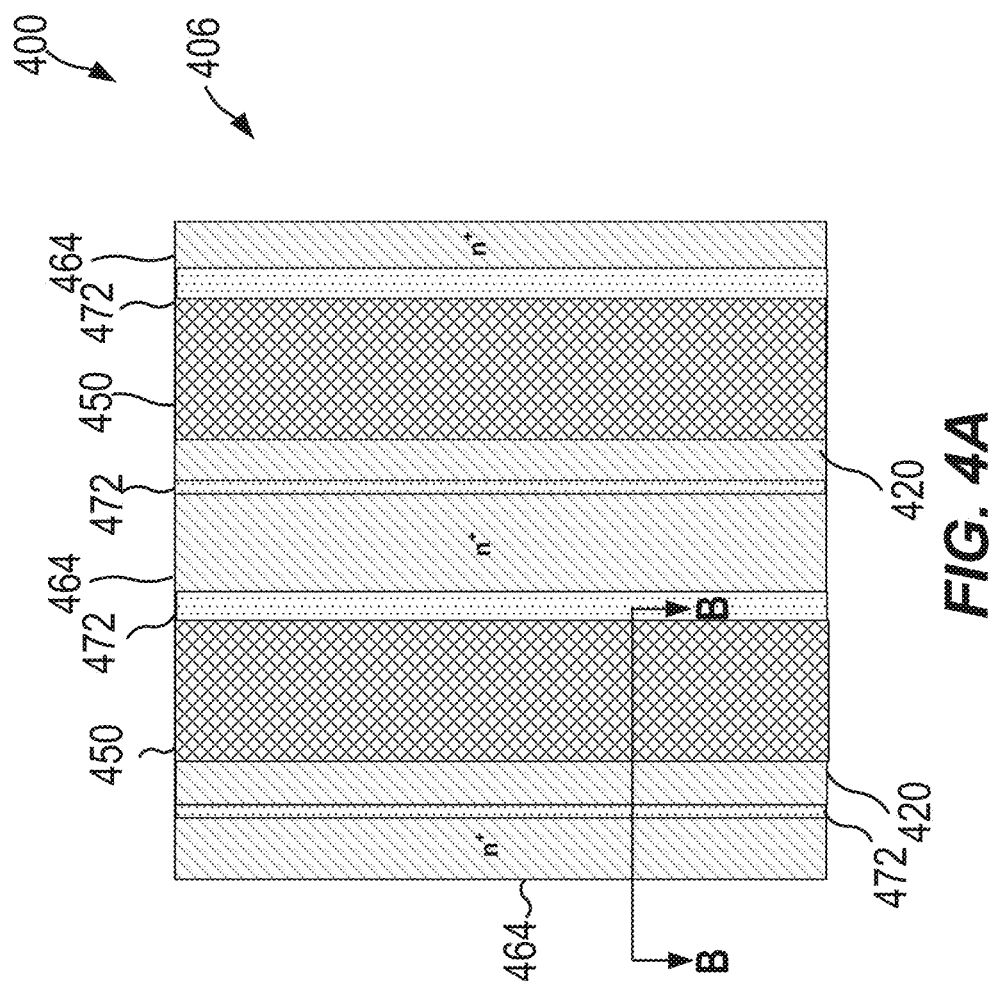
FIGS. 4A-4F are schematic diagrams a gate trench power MOSFET according to embodiments of the present inventive concepts.
Figure 4C:
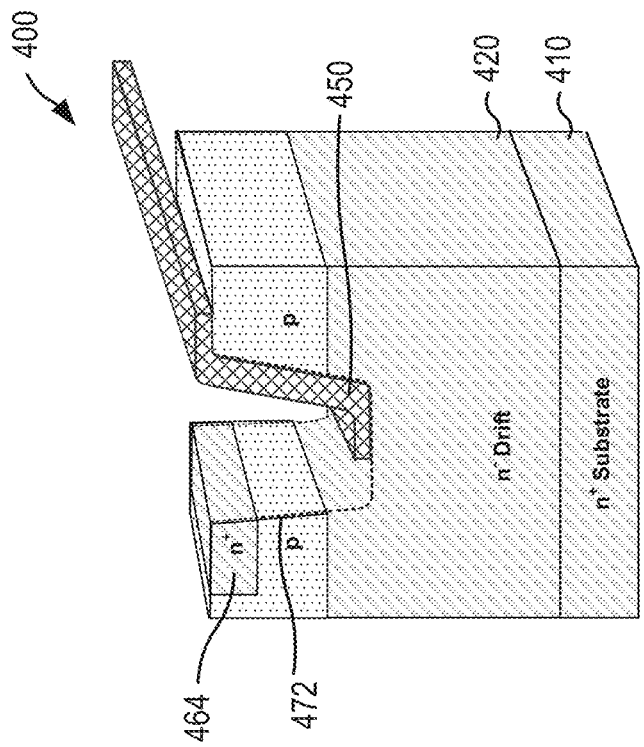
Figure 4B:
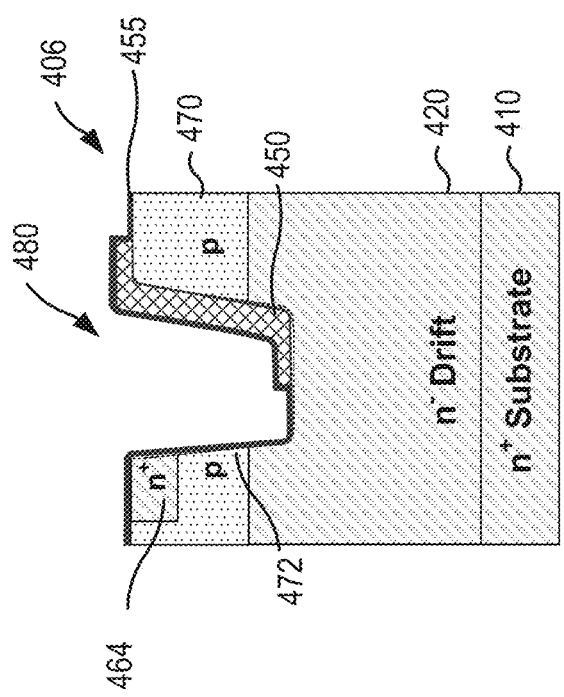
Figure 4D:
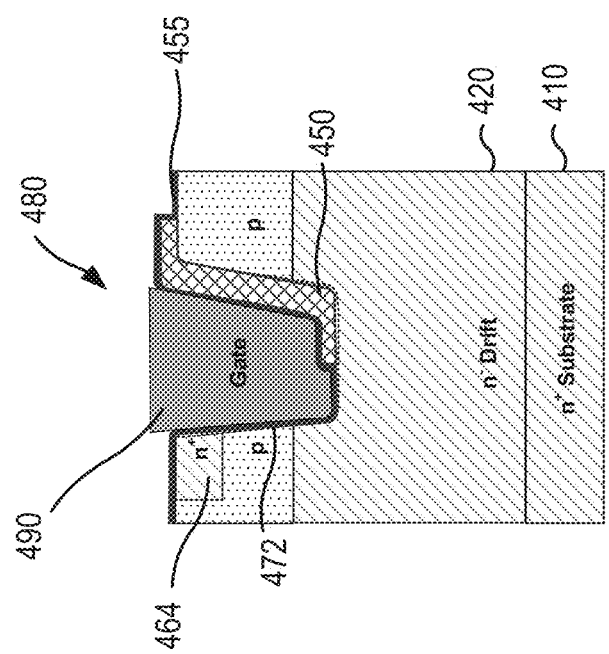

FIGS. 4A-4D are schematic diagrams that illustrate a gate trench power MOSFET according to embodiments of the present inventive concepts. More specifically, FIG. 4A is a plan view of an upper surface of the semiconductor layer structure of a gate trench power MOSFET device. FIG. 4B is a cross-sectional view taken along line B-B of FIG. 4A, and FIG. 4C is a corresponding perspective view. FIG. 4D is a cross-sectional view taken along the line B-B in FIG. 4A that shows the device after gate material 490 (which is not shown in FIGS. 4A-4C) has been formed in the gate trench. Additionally, to better illustrate and explain the gate trench power MOSFET device, oxide layer 455 (discussed below) is omitted in FIGS. 4A and 4C.

Referring to FIGS. 4A-D, a gate trench power MOSFET device 400 may include a semiconductor layer structure 406. The semiconductor device may include a heavily-doped ($n^+$) n-type silicon carbide substrate 410. A lightly-doped ($n^-$) silicon carbide drift region 420 may be formed on the substrate 410 via epitaxial growth. A moderately-doped p-type layer is formed on the upper surface of the n-type silicon carbide drift region 420. A heavily-doped ($n^+$) n-type silicon carbide region is formed in an upper region of the moderately-doped p-type layer via ion implantation. The heavily-doped ($n^+$) n-type silicon carbide region may be a source region. The above-described layers may all be grown in a single epitaxial growth process with process stops to switch between n-type doping and p-type doping (with a subsequent ion implantation step to form the heavily-doped ($n^+$) n-type silicon carbide region in the upper region of the moderately-doped p-type layer). The above-described layers comprise the semiconductor layer structure 406.

A gate trench 480 may be etched into the upper surface of the semiconductor layer structure 406. Although only one gate trench 480 is shown in FIGS. 4B-D, it will be appreciated that a plurality of gate trenches 480 are typically provided, where each gate trench 480 extends in a first direction (e.g., from an upper surface of the n-type silicon carbide layer toward the substrate 410), and the gate trenches 480 are spaced apart from each other in a second direction so that the gate trenches 480 extend in length in parallel to each other. The gate trenches 480 may extend in length in a third direction that may be perpendicular to the first direction, and may be parallel to an upper surface of the substrate 410.

Each gate trench 480 may extend through the heavily-doped n-type silicon carbide layer in order to convert this silicon carbide layer into a plurality of spaced apart regions 464 that will ultimately serve as the source regions of the power MOSFET. Each gate trench 480 may also extend through the moderately-doped p-type silicon carbide layer in order to convert this layer into a plurality of p-wells 472. Each gate trench 480 may also extend into an upper surface of the n-type drift region 420.

As can be seen in FIG. 4B, the etching of the gate trench 480 may result in non-parallel sidewall surfaces thereof. In other words, the sidewalls may be angled with respect to a normal (perpendicular) line to an upper surface of the substrate 410.

After the etching of the gate trench 480, a polysilicon layer 450 may be deposited on top of the upper surface of the semiconductor layer structure 406. The polysilicon layer 450 may be a highly-doped p-type polysilicon layer. The polysilicon layer 450 may be deposited along one sidewall of the gate trench 480, and may conform to the sidewall of the gate trench 480. The polysilicon layer 450 may be a continuous layer that extends in parallel with a length direction of the gate trench 480. The polysilicon layer 450 may be formed, for example, by blanket forming a polysilicon layer on the device and using an etch mask to selectively etch the blanket polysilicon layer. Alternatively, a mask may be formed first and the polysilicon layer may be selectively deposited into openings in the mask. Other techniques may also be used.

Stated differently, the polysilicon layer 450 may be deposited on a sidewall of the n-type drift region 420 and a sidewall of the p-type silicon carbide layer, both of which are exposed via the etched gate trench 480. In some embodiments, a photo process may be used to define the polysilicon layer 450 on the sidewall of the gate trench 480. In some example embodiments, and as seen in FIG. 4B, the polysilicon layer 450 may also be deposited on a portion of a bottom of the gate trench 480 (e.g., on an upper surface of n-type drift region 420 exposed by the gate trench 480), and on an upper portion of the p-wells 472. In some embodiments, a thickness of the polysilicon layer 450 may be in a range of 100 nanometers (nm) to 500 nm, although the present disclosure is not limited thereto.

With reference to FIGS. 4A and 4C, the gate trench 480 and the polysilicon layer 450 may extend unbroken along a length of the device 400 and/or a length of the semiconductor layer structure 406.

After the polysilicon layer 450 is deposited, an oxide layer 455 may be formed. The oxide layer 455 may be formed on/in both the upper surface of the polysilicon layer and on exposed portions of the silicon carbide semiconductor layer structure 406, as shown in FIG. 4B. In some embodiments, the oxide layer 455 may be formed by oxidizing the polysilicon layer 450 and the exposed silicon carbide via an anneal in an oxygen containing environment. It will be appreciated that when the oxide layer 455 is formed by thermal oxidation the polysilicon layer 450 may oxidize more quickly than the exposed silicon carbide surfaces (and the exposed silicon carbide surfaces may also oxidize at different rates depending upon which face of the crystal structure is exposed), and thus the oxide layer 455 may not have a uniform thickness. Additionally or alternatively, the oxide layer 455 may be formed by deposition. Any unnecessary portions of the oxide layer 455 may be removed (e.g., oxidized silicon carbide surfaces that are outside of the gate trenches 480). After the formation of the polysilicon layer 450 and the oxide layer 455, further processing may be performed (e.g., forming a gate insulating layer, gate electrodes, and contacts) to form the power MOSFET. For example, the gate electrode 490 shown in FIG. 4D may be formed.

The device of FIGS. 4A-4D avoids the disadvantages of FIGS. 2A-3C discussed above, as well as avoids potential problems that may arise from implantation of ions into the n-type drift region 420. The formation of the polysilicon layer 450 may also provide a reduced number of operations and/or simplified manufacture of the device.

Figure 4F:
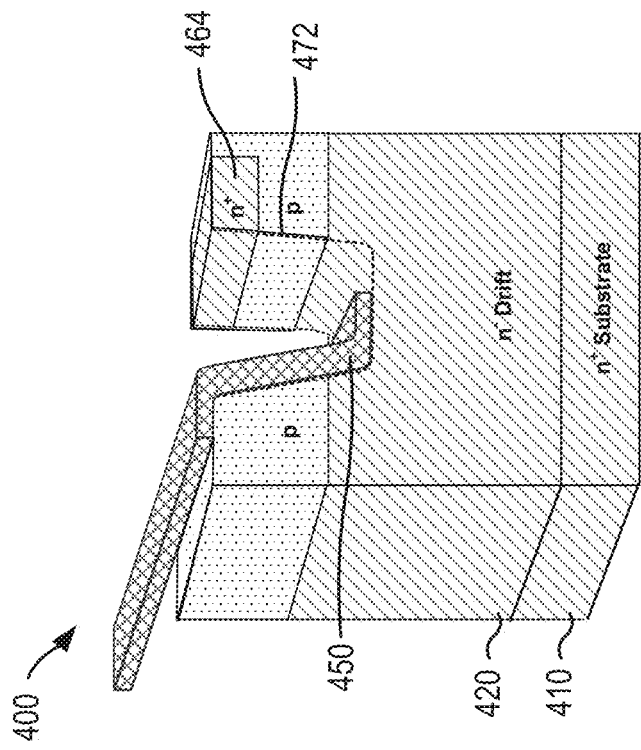
Figure 4E:
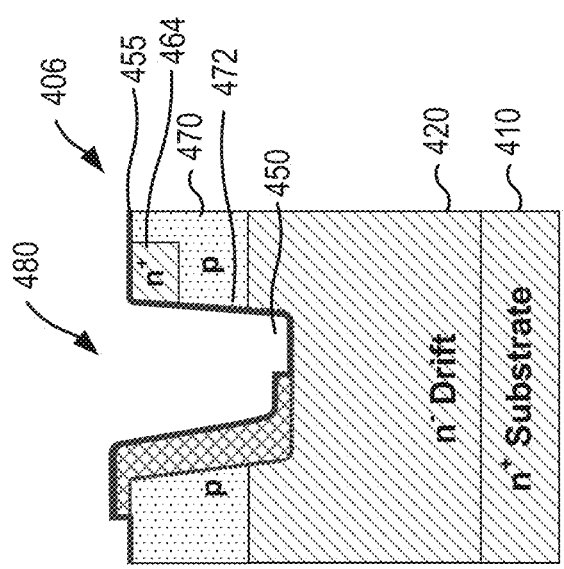

FIGS. 4E and 4F are schematic diagrams that illustrate a gate trench power MOSFET according to embodiments of the present inventive concepts. FIG. 4E is a cross-sectional view, and FIG. 4F is a corresponding perspective view. FIGS. 4E and 4F illustrate that, in some embodiments, the polysilicon layer 450 may be formed on either side of the gate trench 480. In fact, in some embodiments, some gate trenches 480 may have the polysilicon layer 450 formed on the "right" sidewall while other gate trenches 480 in the device may have the polysilicon layer 450 formed on the "left" sidewall (i.e., some gate trenches may have the design of FIGS. 4B-4D, while others have the design of FIGS. 4E-4F). The gate trenches 480 of these devices may thus have a first sidewall (which may be the left sidewall for some gate trenches and the right sidewall for other gate trenches) that does not include the polysilicon layer 450 and a second sidewall (which again may be the left sidewall for some gate trenches and the right sidewall for other gate trenches) that has the polysilicon layer 450 formed thereon.

Figure 14:
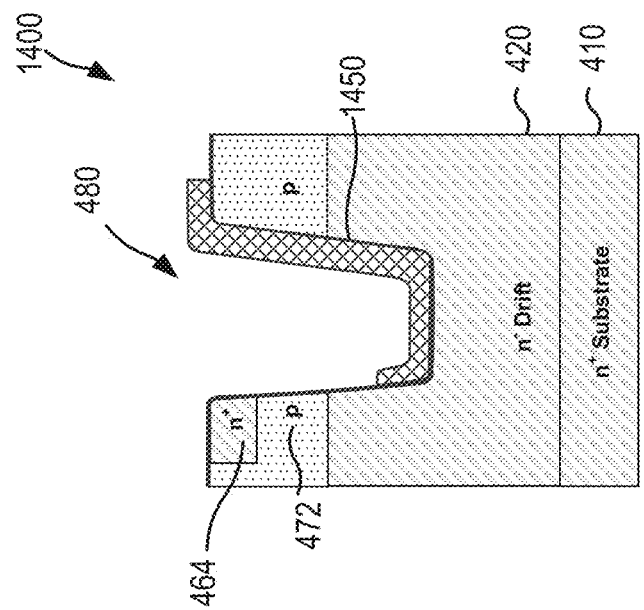
FIG. 14 is a schematic diagram illustrating a gate trench power MOSFET according to embodiments of the present inventive concepts.

FIG. 14 is a schematic diagram that illustrates a gate trench power MOSFET 1400 according to further embodiments of the present inventive concepts. FIG. 14 illustrates that, in some embodiments, the gate trench 480 may be etched so as to extend more deeply into the n-type drift region 420 from an upper surface thereof. A polysilicon layer 1450 may be formed or deposited to cover completely a first sidewall of the gate trench 480 and to cover partially a second sidewall of the gate trench 480. The polysilicon layer 1450 may also cover completely a bottom surface of the gate trench 480. The gate trench 480 and the polysilicon layer 1450 may extend unbroken along a length of the device 400 and/or a length of the semiconductor layer structure 406.

Figure 5C:
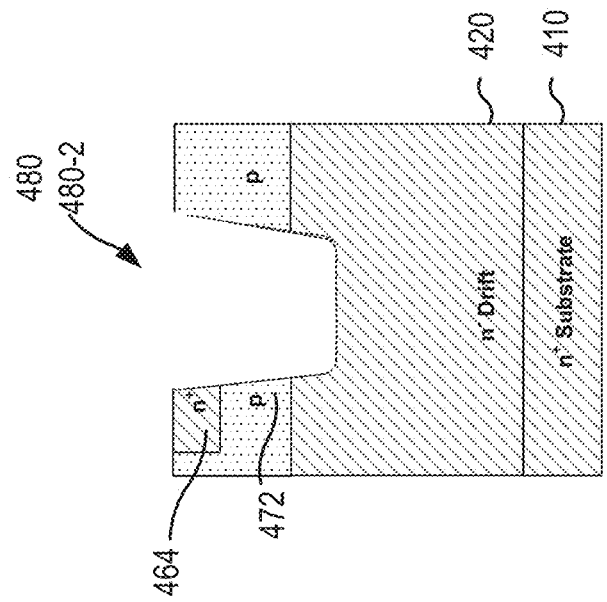
Figure 5B:
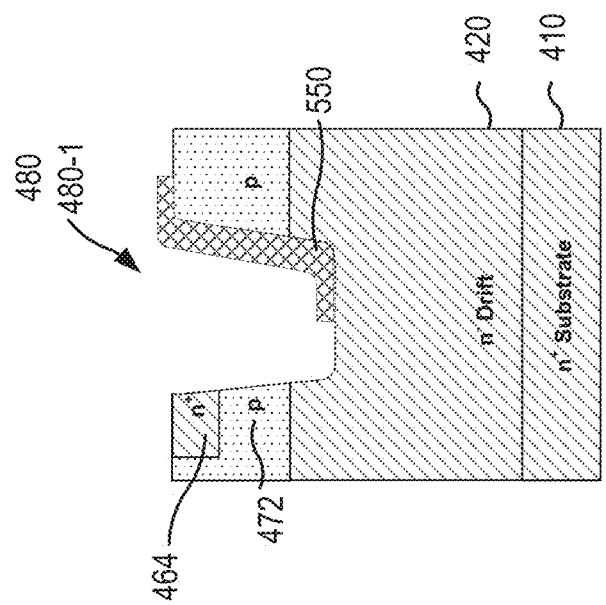
Figures 5D, 5E:
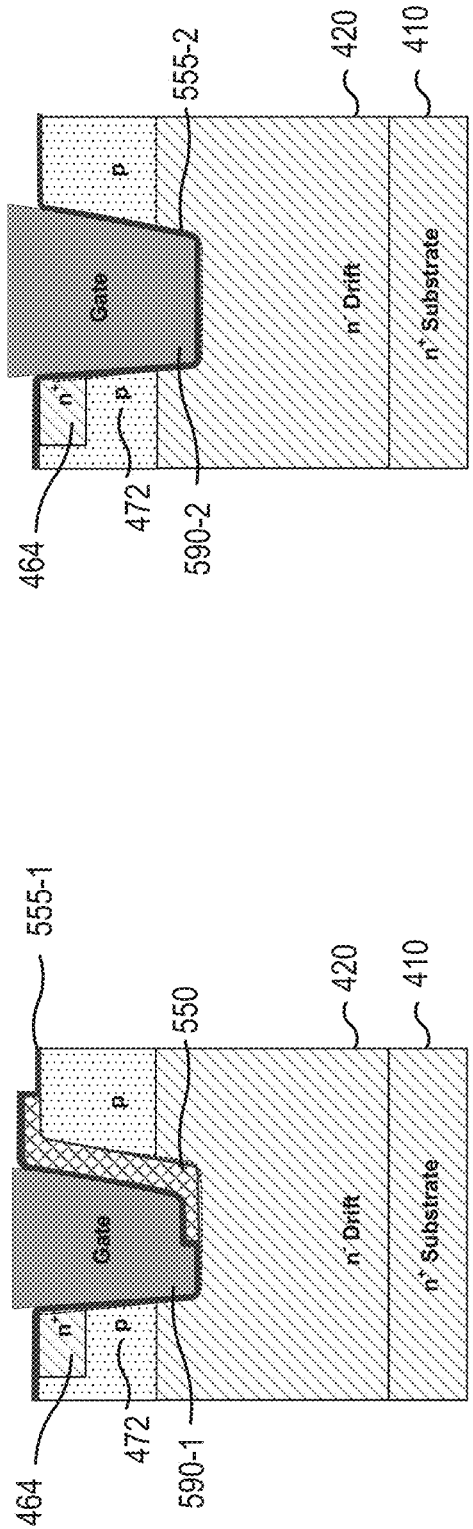

FIGS. 5A-E are schematic diagrams that illustrate a gate trench power MOSFET according to embodiments of the present inventive concepts. More specifically, FIG. 5A is a plan view of an upper surface of a gate trench power MOSFET device, and FIGS. 5B, 5C, 5D and 5E are cross-sectional views. FIG. 5B is taken along the line B-B in FIG. 5A. FIG. 5C is taken along the line C-C in FIG. 5A. FIGS. 5D and 5E correspond respectively to FIGS. 5B and 5C, but also include gate material 590, which has been excluded from FIGS. 5A-5C to illustrate better the polysilicon layer within the gate trench. Additionally, to better illustrate and explain the gate trench power MOSFET device, an oxide layer 555 is omitted in FIGS. 5A, 5B and 5C.

Referring to FIGS. 5A-E, a gate trench power MOSFET device 500 may include a semiconductor layer structure 506. As formed, the semiconductor layer structure 506 may be identical to the semiconductor layer structure 406 of FIGS. 4A-D, and hence further description thereof will be omitted here.

A gate trench 480 may be etched into the upper surface of the semiconductor layer structure 506. The gate trench 480 may be identical to the gate trench 480 of FIGS. 4A-D, and hence further description thereof will be omitted here.

A polysilicon layer 550 may be deposited on top of the upper surface of the semiconductor layer structure 506. The polysilicon layer 550 may be a highly-doped p-type polysilicon layer. The polysilicon layer 550 may be deposited along one sidewall of the gate trench 480 in non-continuous regions, each of which may conform to the sidewall of the gate trench 480. Stated differently, there may be first regions 480-1 of the gate trench 480 at which the polysilicon layer 550 is deposited, and there may be second regions 480-2 of the gate trench 480 which are free from the polysilicon layer 550. The first regions 480-1 of the gate trench 480 may alternate with the second regions 480-2 of the gate trench 480 in the third direction (e.g., in the direction in which the gate trench 480 extends in length). Each first region 480-1 of the gate trench 480 may be between a pair of adjacent second regions 480-2 of the gate trench 480, and/or each second region 480-1 of the gate trench 480 may be between a pair of adjacent first regions 480-1 of the gate trench 480. In some example embodiments, a patterned mask layer and/or photo process may be used to deposit the polysilicon layer 550 in the first regions 480-1 of the gate trench 480.

The polysilicon layer 550 in the first regions 480-1 may be deposited on one of the sidewalls of the trench 480. As shown for example, in FIG. 5B, each sidewall of the gate trench 480 is formed by an exposed portion of n-type drift region 420 and one of the p-wells 472. In some example embodiments, and as seen in FIG. 5B, the polysilicon layer 550 may also be deposited on a portion of a bottom of the first portion 480-1 of the gate trench 480 (e.g., on an upper surface of n-type drift region 420 exposed by the gate trench 480), and on an upper portion of the p-well 472 that is adjacent the first portion 480-1 of the gate trench 480. In some embodiments, a thickness of the polysilicon layer 450 may be in a range of 100 nanometers (nm) to 500 nm, although the present disclosure is not limited thereto.

After the polysilicon layer 550 is deposited in the first regions 480-1 of the etched gate trench 480, an oxide layer 555 may be formed. The oxide layer 555 may include a first portion 555-1 that is formed on the polysilicon layer 550, or in other words is formed on the polysilicon layer 550 in the first regions 480-1 of the etched gate trench 480. The oxide layer 555 may also include a second portion 555-2 that is formed on the components of the semiconductor layer structure 506, for example the surfaces of the drift region 420, the p-wells 472, and the heavily-doped n-type silicon carbide regions 464 that are exposed in the second regions 480-2 of the gate trench 480. For example, in the first regions 480-1 of the gate trench of the polysilicon layer 550 may be oxidized via an anneal in an oxygen containing environment, resulting in the first portion 555-1 of the oxide layer 555. In the second regions 480-2 of the gate trench, the surfaces of the drift region 420, the p-type silicon carbide layer 470, and the heavily-doped n-type silicon carbide regions 464 that are exposed in the second regions 480-2 may be oxidized via an anneal in an oxygen containing environment, resulting in the second portion 555-2 of the oxide layer 555. Additionally or alternatively, the oxide layer 455 may be formed by deposition. The first portion 555-1 of the oxide layer 555 may have a different cross-section than the second portion 555-2 of the oxide layer. The oxide layer 555 may have different thicknesses in different regions for the same reasons discussed above with respect to the embodiment of FIGS. 4A-D.

After the formation of the polysilicon layer 450 and the oxide layer 555, further processing may be performed (e.g., forming a gate insulating layer, gate electrodes, and contacts) to form the power MOSFET. For example, the gate electrode 590 shown in FIGS. 5D and 5E may be formed. As with the oxide layer 555, the gate electrode 590 may have a different cross-section 590-1 in the first region 480-1 of the gate trench than a cross-section 590-2 in the second region 480-2.

The example embodiments of FIGS. 5A-5E may provide that, in the second regions 480-2 where the sidewall of the gate trench 480 is free of the polysilicon layer 550, the channel may conduct current along that sidewall, for example via the p-well that is formed there. Note that in FIG. 5A the polysilicon layers in adjacent gate trenches are shown as being aligned. It will be appreciated that embodiments of the present invention are not limited to such an arrangement. For example, in other embodiments, the polysilicon layers 455 in adjacent trenches may be fully offset from each other (i.e., so that no part of the polysilicon layers are aligned in the horizontal direction of the view of FIG. 5A) or may be partly offset from each other.

Figure 5G:
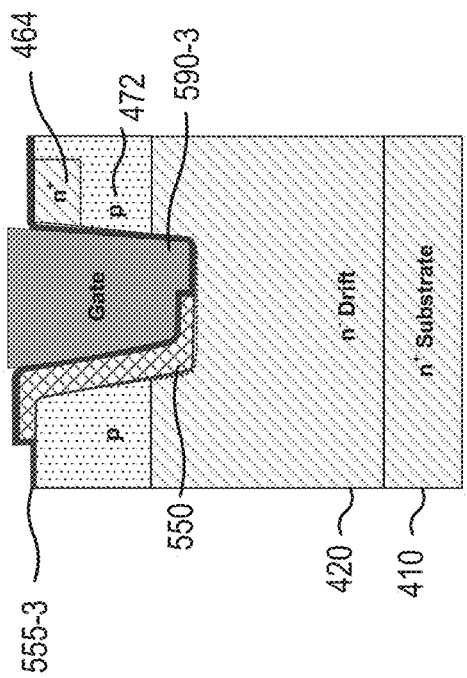
Figure 5F:
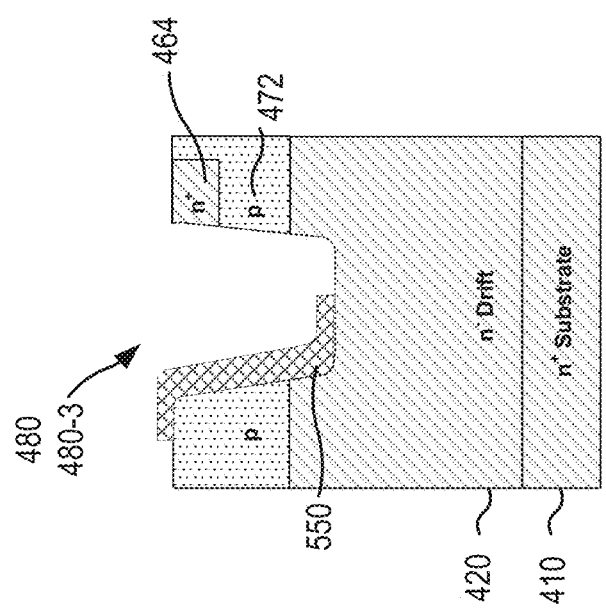

FIGS. 5F and 5G are schematic diagrams that illustrate a gate trench power MOSFET according to further embodiments of the present inventive concepts. FIG. 5F is a cross-sectional view, and FIG. 5G includes gate material 590, which has been excluded from FIG. 5F to illustrate better the polysilicon layer within the gate trench of FIG. 5F. FIGS. 5F and 5G illustrate that, in some embodiments, the polysilicon layer 550 may be formed on either side of the gate trench 480. Moreover, in some embodiments, gate trenches 480 may be provided with first regions 480-1 (as seen in FIG. 5B), second regions 480-2 (as seen in FIG. 5C), and third regions 480-3 (as seen in FIG. 5G). In the first regions 480-1 of the gate trench 480, the polysilicon layer 550 may be formed on a first sidewall 480-R of the gate trench 480. In the third regions 480-3 of the gate trench 480, the polysilicon layer 550 may be formed on a second sidewall 480-L of the gate trench 480. In the second regions 480-2, both the first and second sidewalls 480-R, 480-L of the gate trench may be free from the polysilicon layer 550. In the first and third regions 480-1 and 480-3, channels may conduct current via the sidewall free from the polysilicon layer 550, and in the second regions 480-2 (where both sidewalls of the gate trench 480 are free of the polysilicon layer 550), channels may conduct current along both sidewalls, for example via the p-wells that are formed there.

Figure 15B:
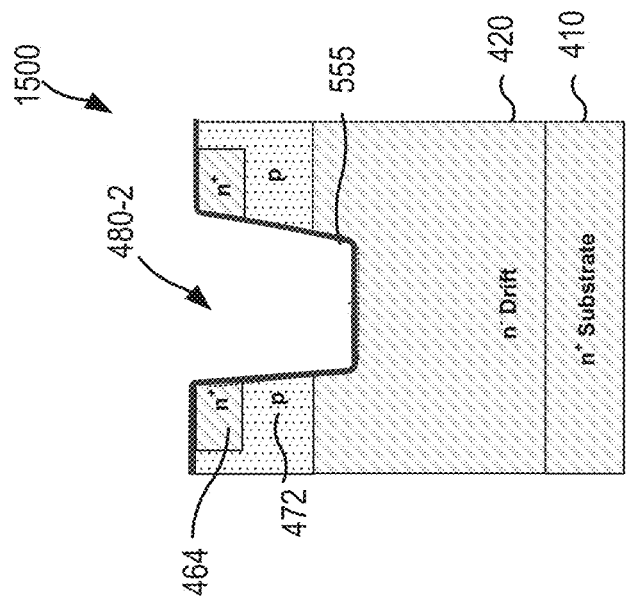
FIGS. 15A-B are schematic diagrams illustrating a gate trench power MOSFET according to embodiments of the present inventive concepts.
Figure 15A:
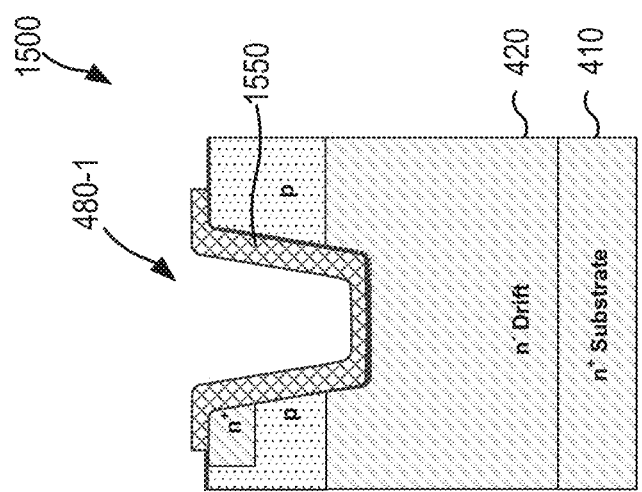

FIGS. 15A and 15B are schematic diagrams that illustrate a gate trench power MOSFET 1500 according to further embodiments of the present inventive concepts. FIGS. 15A and 15B illustrate that, in some embodiments, in first regions 480-1, the polysilicon layer 1550 may be formed on both sides of the gate trench 480, and in second regions 480-2, both the first and second sidewalls of the gate trench may be free from the polysilicon layer 1550. In the first regions 480-1, no current may be conducted, as both sidewalls are covered by the polysilicon layer 1550, and in the second regions 480-2 (where both sidewalls of the gate trench 480 are free of the polysilicon layer 1550), channels may conduct current along both sidewalls, for example via the p-wells that are formed there.

Figure 6D:
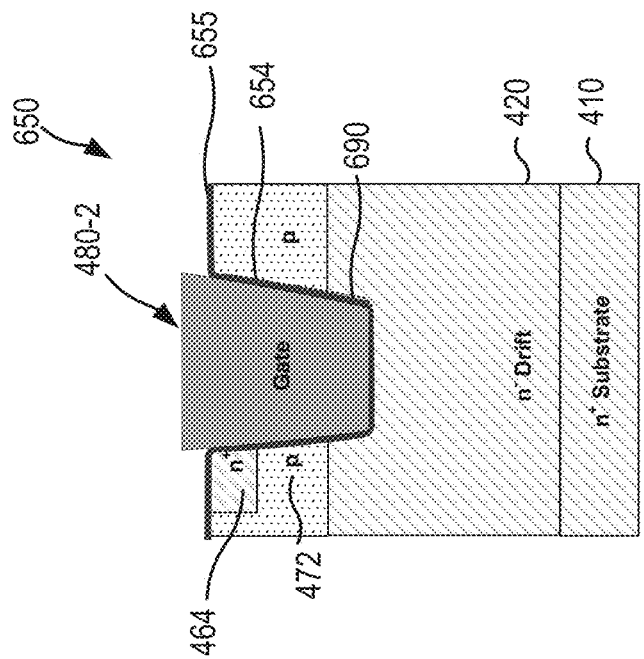
Figure 6C:
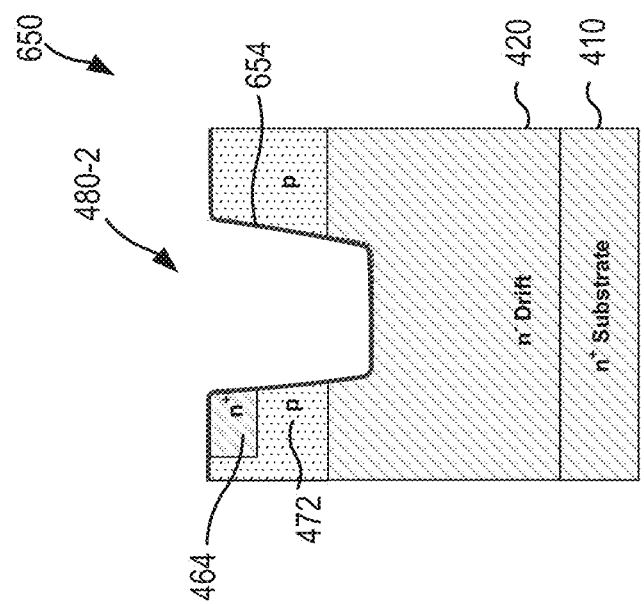

FIGS. 6A-6B are schematic cross-sectional diagrams illustrating a gate trench power MOSFET device 600 according to embodiments of the present inventive concepts. FIGS. 6C and 6D are cross-sectional views of a gate trench power MOSFET device 600', and illustrate regions of the device that have different cross-sections from what is shown in FIGS. 6A and 6B.

With reference to FIGS. 6A and 6B, the gate trench power MOSFET device 600 may be similar to the gate trench power MOSFET device 400 described with reference to FIGS. 4A-4D, except that MOSFET device 600 further includes an additional oxide layer 654 which is between the sidewall of the gate trench 480 and the polysilicon layer 450.

The gate trench power MOSFET device 600 may include a semiconductor layer structure 406 having gate trenches 480 formed therein. The semiconductor layer structure 406 and the gate trenches 480 may be identical to the semiconductor layer structure 406 and gate trenches, respectively, of the embodiment of FIGS. 4A-D, and hence further description thereof will be omitted here.

Prior to deposition of a polysilicon layer 450, a lower oxide layer 654 may be formed. For example, the surfaces of the drift region 420, the p-type wells 472, and the heavily-doped n-type silicon carbide regions 464 that are exposed in the gate trench 480 may be oxidized via an anneal in an oxygen containing environment, resulting in the lower oxide layer 654. Additionally or alternatively, the lower oxide layer 654 may be formed by deposition.

A polysilicon layer 450 may be deposited on top of the upper surface of the semiconductor layer structure 506 and/or on the upper surface of the lower oxide layer 654. The polysilicon layer 450 may be identical to the polysilicon layer 450 discussed above with reference to the embodiment of FIGS. 4A-D, except that in the embodiment of FIGS. 6A-B the polysilicon layer 450 is formed on the lower oxide layer 654 as opposed to being directly formed on the underlying semiconductor layer structure 606. As such, further description of the polysilicon layer 450 will be omitted here.

After the polysilicon layer 450 is deposited, an upper oxide layer 655 may be formed. For example, the polysilicon layer 450 and exposed surfaces of the semiconductor layer structure 606 may be oxidized via an anneal in an oxygen containing environment. Additionally or alternatively, the upper oxide layer 655 may be formed by deposition. The upper oxide layer 655 may be formed via a different process than the lower oxide layer 654. After the formation of the polysilicon layer 450 and the upper oxide layer 655, further processing may be performed (e.g., forming a gate insulating layer, gate electrodes, and contacts) to form the power MOSFET. For example, the gate electrode 490 shown in FIG. 6B may be formed.

The gate trench power MOSFET device 600 corresponds to the gate trench power MOSFET device 400 of FIGS. 4A-D, with the addition of the lower oxide layer 654. It will be appreciated that the gate trench power MOSFET device 500 of FIGS. 5A-D can similarly be modified to include a lower oxide layer 654 to provide a gate trench power MOSFET device 600'. FIGS. 6A-D illustrate such a gate trench power MOSFET device 600'. In particular, FIGS. 6A-B, discussed above, illustrate cross-sections of the device 600' that include the polysilicon layer 450 (and hence correspond to the cross-sections of FIGS. 5B and 5D). FIGS. 6C and 6D illustrate cross-sections of the device 600' that do not include the polysilicon layer 450 (and hence correspond to the cross-sections of FIGS. 5C and 5E).

As shown in FIGS. 6C-D, the lower oxide layer is formed throughout the gate trenches 480 (including the portions 480-2 thereof that does not include the polysilicon layer 550).

After the lower oxide layer 654 is formed, the polysilicon layer 550 may be deposited along one sidewall of the gate trench 480 in non-continuous regions, each of which may conform to the sidewall of the gate trench 480. Stated differently, there may be first regions 480-1 of the gate trench 480 at which the polysilicon layer 550 is deposited, and there may be second regions 480-2 of the gate trench 480 which are free from the polysilicon layer 550. The first regions 480-1 of the gate trench 480 may alternate with the second regions 480-2 of the gate trench 480 in the third direction (e.g., in the direction in which the gate trench 480 extends in length). Each first region 480-1 of the gate trench 480 may be between a pair of adjacent second regions 480-2 of the gate trench 480, and/or each second region 480-1 of the gate trench 480 may be between a pair of adjacent first regions 480-1 of the gate trench 480. In some example embodiments, a patterned mask layer and/or photo process may be used to deposit the polysilicon layer 550 in the first regions 480-1 of the gate trench 480.

As noted above, the portions of the gate trench power MOSFET 650 having the first regions 480-1 of the gate trench 480 may be identical to the gate trench power MOSFET 600 shown in FIGS. 6A-B, and reference is made to the description thereof, above. After the polysilicon layer is deposited in the first regions 480-1 of the etched gate trench 480, an upper oxide layer 655 may be formed. The upper oxide layer 655 may include a first portion that is formed on the polysilicon layer 550, or in other words is formed on the polysilicon layer in the first regions 480-1 of the etched gate trench 480. The upper oxide layer 655 may also include a second portion that is formed on the components of the semiconductor layer structure, for example the surfaces of the drift region 420, the p-type wells 472, and the heavily-doped n-type silicon carbide regions 464 that are exposed in the second regions 480-2 of the gate trench 480.

The addition of the lower oxide layer 654 may provide an additional benefit of blocking hole injection to the polysilicon layer 450 when high voltage is applied to the drain.

Figure 7:
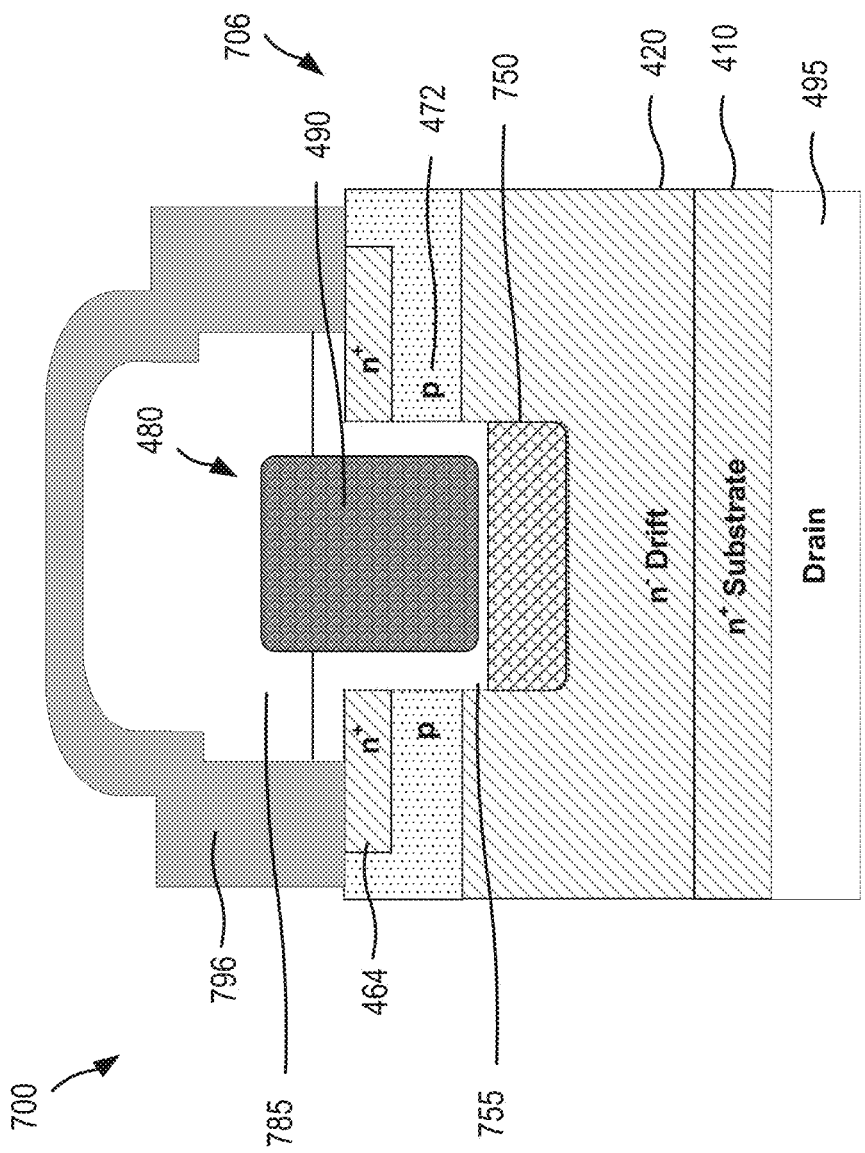
FIG. 7 is a schematic diagram illustrating a gate trench power MOSFET according to embodiments of the present inventive concepts.

FIG. 7 is a schematic cross-sectional diagram illustrating a gate trench power MOSFET 700 according to embodiments of the present inventive concepts.

The gate trench power MOSFET device 700 may include a semiconductor layer structure 706. The semiconductor layer structure 706 may be similar to semiconductor layer structure 406 of FIGS. 4A-D. For example, the semiconductor layer structure 706 may include a heavily-doped (n$^+$) n-type silicon carbide substrate 410, a lightly-doped (n$^−$) silicon carbide drift region 420 formed on the substrate 410 via epitaxial growth, a moderately-doped p-wells 472 that are formed on the upper surface of the n-type silicon carbide drift region 420, and heavily-doped (n$^+$) n-type silicon carbide regions 464 formed in upper regions of the respective moderately-doped p-wells 472 via ion implantation.

A gate trench 480 may be etched into the upper surface of the semiconductor layer structure 706. Although only one gate trench 480 is shown in FIG. 7, it will be appreciated that a plurality of gate trenches 480 are typically provided, where each gate trench 480 extends in a first direction (e.g., from an upper surface of the n-type silicon carbide layer toward the substrate 410), and the gate trenches 480 are spaced apart from each other in a second direction so that the gate trenches 480 extend in parallel to each other. The gate trenches 480 may be substantially identical to the gate trenches 480 of the embodiment of FIGS. 4A-D, except that the gate trenches in the present embodiment may extend deeper into the semiconductor layer structure 706. Each gate trench 480 may also extend into an upper surface of the n-type drift region 420.

A polysilicon layer 750 may be deposited at the bottom of the gate trench 480. The polysilicon layer 750 may fill the bottom portion of the gate trench. The polysilicon layer 750 may be a continuous layer that extends in parallel with a length direction of the gate trench 480. Stated differently, the polysilicon layer 750 may be deposited on an upper surface of the n-type drift region 420 exposed by the gate trench 480, but a sidewall of the p-well 472 may be free from the polysilicon layer 750. A photo process may be used to define the polysilicon layer 750 on the bottom of the gate trench 480.

In some embodiments, and with reference to FIGS. 5B-5E, the polysilicon layer 750 may also be deposited along one sidewall of the gate trench 480 in at least first regions 480-1 of the gate trench 480.

After the polysilicon layer 750 is deposited, an oxide layer 755 may be formed. For example, the polysilicon layer 750 and exposed surfaces of the semiconductor layer structure 606 may be oxidized via an anneal in an oxygen containing environment. Additionally or alternatively, the oxide layer 755 may be formed by deposition. After the formation of the polysilicon layer 750 and the oxide layer 755, further processing may be performed (e.g., forming a gate insulating layer, gate electrodes, and contacts) to form the power MOSFET. For example, as seen in FIG. 7, an intermetal dielectric layer 785, source contacts 796, drain contact 765, and a gate electrode 490 may be formed.

Figure 8:
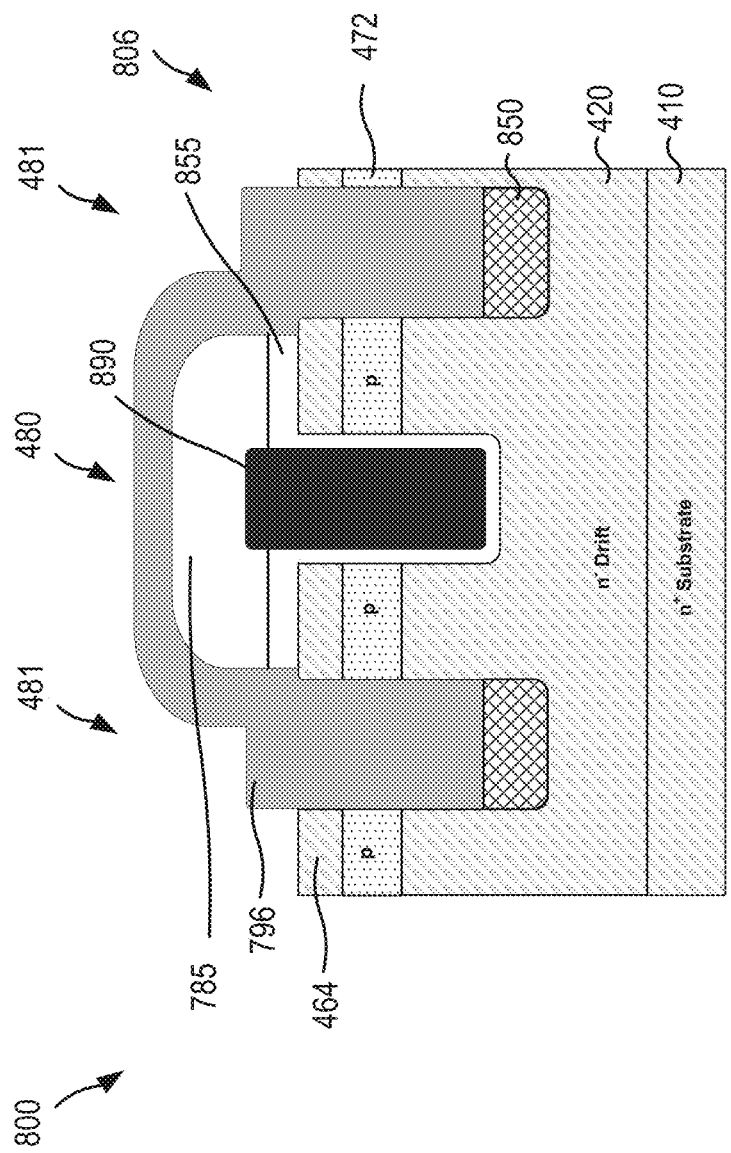
FIG. 8 is a schematic diagram illustrating a gate trench power MOSFET according to embodiments of the present inventive concepts.
Figure 9:
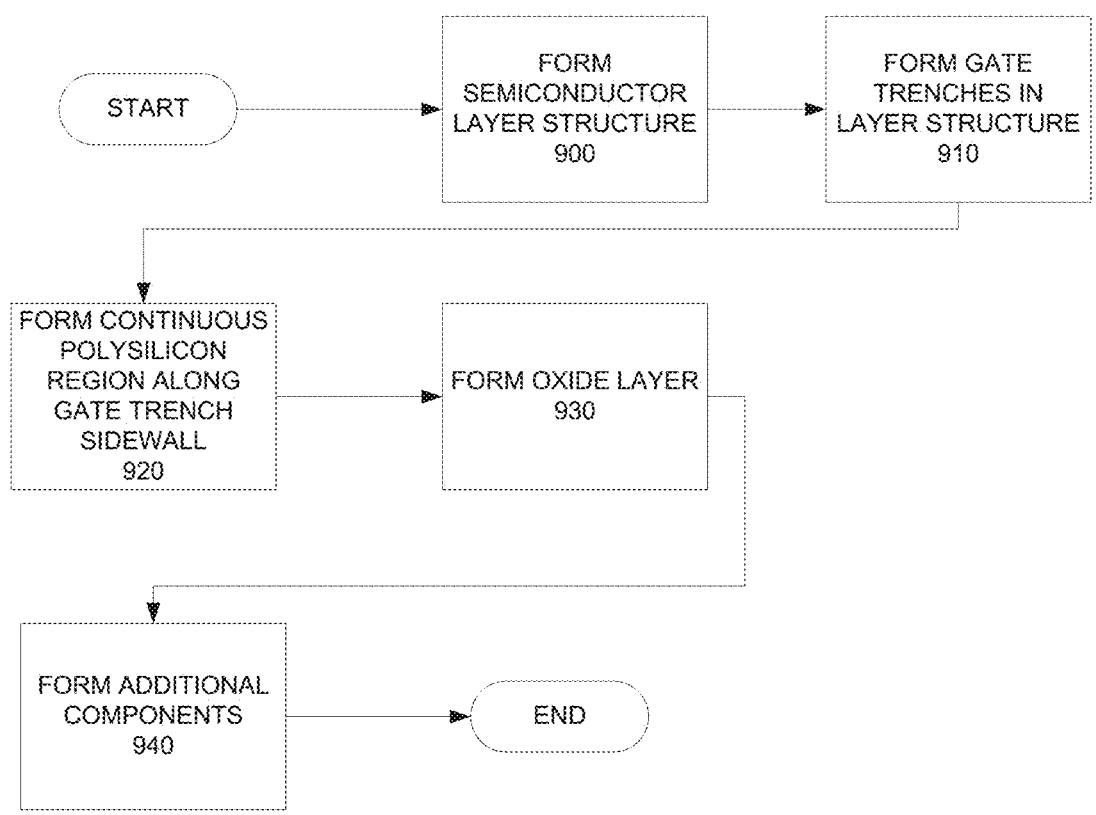
FIGS. 9-13 are flow charts illustrating methods of fabricating gate trench power semiconductor devices according to embodiments of the present inventive concepts.
Figure 10:
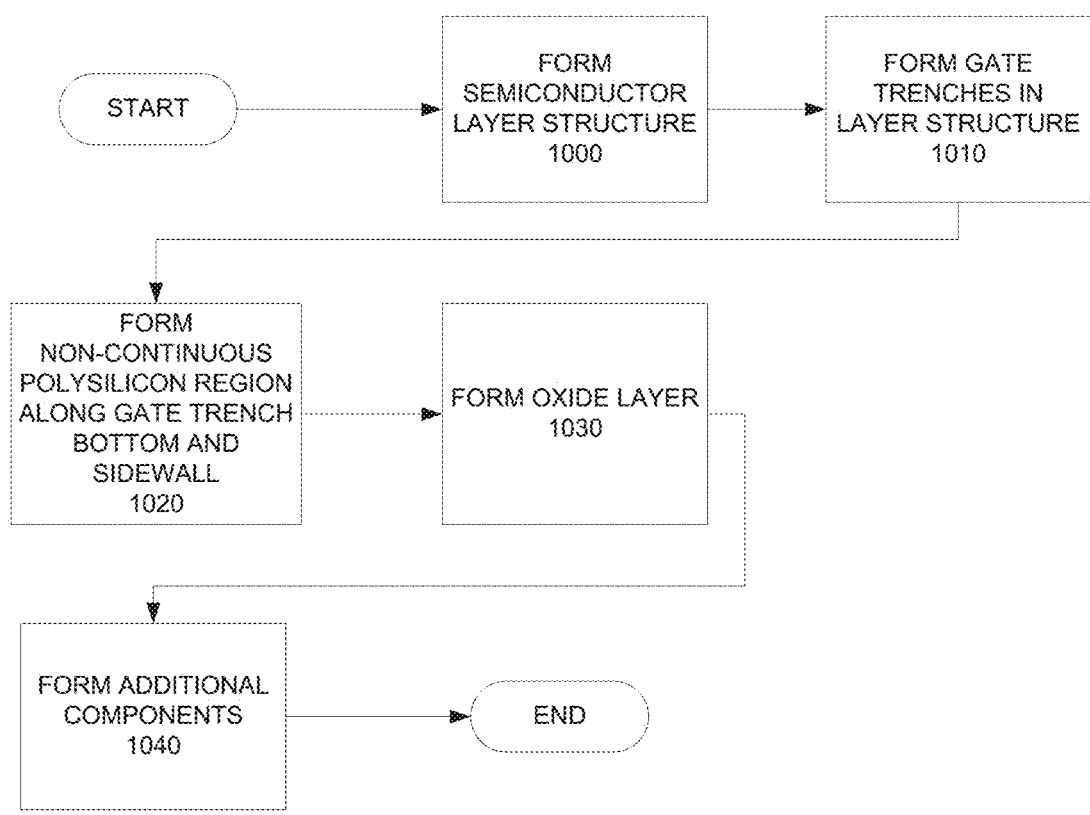
Figure 11:
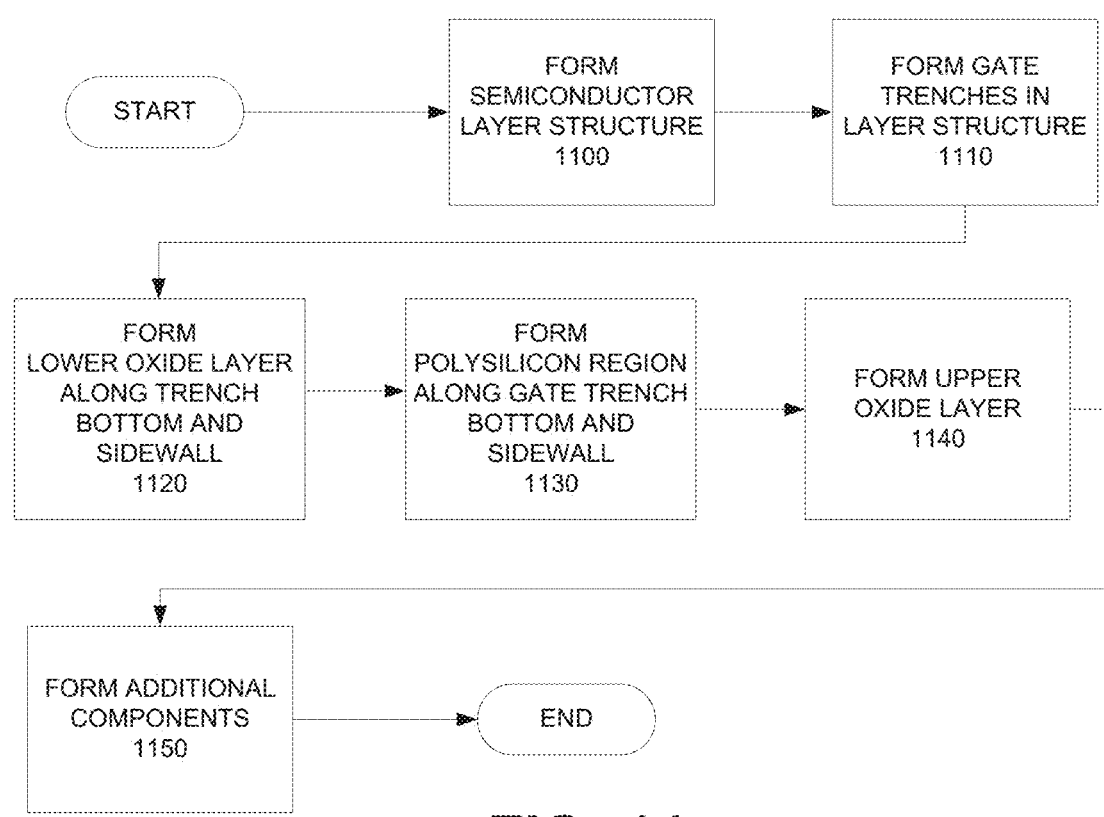

FIG. 8 is a schematic cross-sectional diagram illustrating a gate trench power MOSFET according to embodiments of the present inventive concepts. The gate trench power MOSFET device 800 may include a semiconductor layer structure 806. The semiconductor layer structure 806 may be similar to semiconductor layer structure 406 of FIGS. 4A-D. For example, the semiconductor layer structure 806 may include a heavily-doped (n$^+$) n-type silicon carbide substrate 410, a lightly-doped (n$^−$) silicon carbide drift region 420 formed on the substrate 410 via epitaxial growth, a moderately-doped p-type layer formed on the upper surface of the n-type silicon carbide drift region 420, and a heavily-doped (n$^+$) n-type silicon carbide layer formed in an upper region of the moderately-doped p-type layer 470 via ion implantation. The silicon carbide regions 464 may be source regions. The layers described above may all be grown in a single epitaxial growth process with process stops to switch between n-type doping and p-type doping.

A plurality of gate trenches 480 may be etched into the upper surface of the semiconductor layer structure 806 (only one gate trench 480 is shown in FIG. 8). Each gate trench 480 extends in a first direction (e.g., from an upper surface of the n-type silicon carbide layer toward the substrate 410), and the gate trenches 480 are spaced apart from each other in a second direction so that the gate trenches 480 extend in parallel to each other. The gate trenches 480 may extend in length in a third direction that may be perpendicular to the first direction, and may be parallel to an upper surface of the substrate 410. In addition, a plurality of source trenches 481 may be etched into the upper surface of the semiconductor layer structure 806 (two source trenches 481 are shown in FIG. 8). The source trenches 481 may be formed in the same etching process used to form the gate trenches 480, or may be at least partly formed in a different etching process. For example, the source trenches 481 may be formed to be deeper than the gate trenches 480 so that a polysilicon layer (described below) formed in the bottom of the source trenches 481 may provide better protection to the bottoms of the gate trenches 480. The trenches 480, 481 may extend through the heavily-doped n-type silicon carbide layer in order to convert the heavily-doped n-type silicon carbide layer into a plurality of spaced apart regions 464 that will ultimately serve as the source regions 460 of the power MOSFET. The trenches 480, 481 may also extend through the moderately-doped p-type silicon carbide layer in order to convert the moderately-doped p-type silicon carbide layer into a plurality of p-wells 472. The trenches 480, 481 may also extend into an upper surface of the n-type drift region 420.

An oxide layer 855 may be formed in each gate trench 480. For example, exposed surfaces of the semiconductor layer structure 706 may be oxidized via an anneal in an oxygen containing environment. Additionally or alternatively, the oxide layer 855 may be formed by deposition. After the formation of the oxide layer 855, gate electrodes 890 may be formed in the gate trenches 480, and an intermetal dielectric layer 785 may be formed over the gate electrodes. Corresponding oxide layers 855 may also be formed in the source trenches 481 (not shown), which may thereafter optionally be removed. Next, a polysilicon layer 850 may be deposited in the bottom of each source trench 481. The polysilicon layer 850 may be a continuous layer that extends in parallel with a length direction of the source trenches 481. Source metallization 796 may then be deposited within the source trenches and over the top of the device to form the source contact.

FIGS. 9-13 are flow charts that illustrate methods of fabricating a gate trench power semiconductor device according to embodiments of the present inventive concepts.

With reference to FIG. 9 and FIGS. 4A-4D, operations may begin with formation of a wide band-gap semiconductor layer structure (Block 900). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. In some embodiments, the semiconductor layer structure may include a current spreading layer that has the first conductivity type. A plurality of gate trenches are formed in an upper surface of the semiconductor layer structure (Block 910). The gate trenches may extend in a first direction and may be spaced apart from each other in a second direction that is perpendicular to the first direction. Each gate trench may extend in length in a third direction that is perpendicular to the first direction. Each gate trench may have a bottom surface, a first sidewall that extends in the first direction and a second sidewall that extends in the first direction. A polysilicon layer may be formed on a sidewall (e.g., the second sidewall) of the gate trench (Block 920). In some embodiments, the polysilicon layer may be deposited on one or more upper surfaces of the semiconductor layer structure. The polysilicon layer and/or the one or more upper surfaces of the semiconductor layer structure may be oxidized or an oxide may be deposited, resulting in an oxide layer (Block 930). Additional components, such as gate insulating layers, gate electrodes, and contacts may be formed on the top and bottom surfaces of the semiconductor layer structure to complete the device (Block 940).

With reference to FIG. 10 and FIGS. 5A-5E, operations may begin with formation of a wide band-gap semiconductor layer structure (Block 1000). The semiconductor layer structure may be formed in the same manner as described above with reference to Block 900 of FIG. 9, and hence further description thereof will be omitted. A plurality of gate trenches are formed in an upper surface of the semiconductor layer structure (Block 1010). The gate trenches may be formed in the same manner as described above with reference to Block 910 of FIG. 9, and hence further description thereof will be omitted. A polysilicon layer may be formed on first regions of a sidewall (e.g., the second sidewall) of the gate trench (Block 1020). Stated differently, the polysilicon layer may be formed in first regions of the gate trench. Second regions of the sidewall and of the gate trench may be free of the polysilicon layer. The polysilicon layer may be deposited on one or more upper surfaces of the semiconductor layer structure. The polysilicon layer and/or the one or more upper surfaces of the semiconductor layer structure may be oxidized or an oxide may be deposited, resulting in an oxide layer (Block 1030). The oxide layer may have a first cross-section in the first portion of the gate trench and a second, different cross-section in the second portion of the gate trench. Additional components, such as gate insulating layers, gate electrodes, and contacts may be formed on the top and bottom surfaces of the semiconductor layer structure to complete the device (Block 1040). The gate electrode may have a first cross-section in the first portion of the gate trench and a second, different cross-section in the second portion of the gate trench.

With reference to FIG. 11 and FIGS. 6A-6D, operations may begin with formation of a wide band-gap semiconductor layer structure (Block 1100). The semiconductor layer structure may be formed in the same manner as described above with reference to Block 900 of FIG. 9, and hence further description thereof will be omitted. A plurality of gate trenches are formed in an upper surface of the semiconductor layer structure (Block 1110). The gate trenches may be formed in the same manner as described above with reference to Block 910 of FIG. 9, and hence further description thereof will be omitted. The one or more upper surfaces of the semiconductor layer structure may be oxidized or an oxide may be deposited, resulting in a lower oxide layer (Block 1120). A polysilicon layer may be formed on a sidewall (e.g., the second sidewall) of the gate trench (Block 1130). The polysilicon layer may be deposited on one or more upper surfaces of the semiconductor layer structure. In some embodiments, the polysilicon layer may be a continuous region extending a length of the gate trench in the third direction. In other embodiments, the polysilicon layer may be formed in first regions of the gate trench, and second regions of the gate trench may be free of the polysilicon layer. The polysilicon layer and/or the one or more upper surfaces of the semiconductor layer structure may be oxidized, resulting in an upper oxide layer (Block 1140). Additional components, such as gate insulating layers, gate electrodes, and contacts may be formed on the top and bottom surfaces of the semiconductor layer structure to complete the device (Block 1150).

Figure 12:
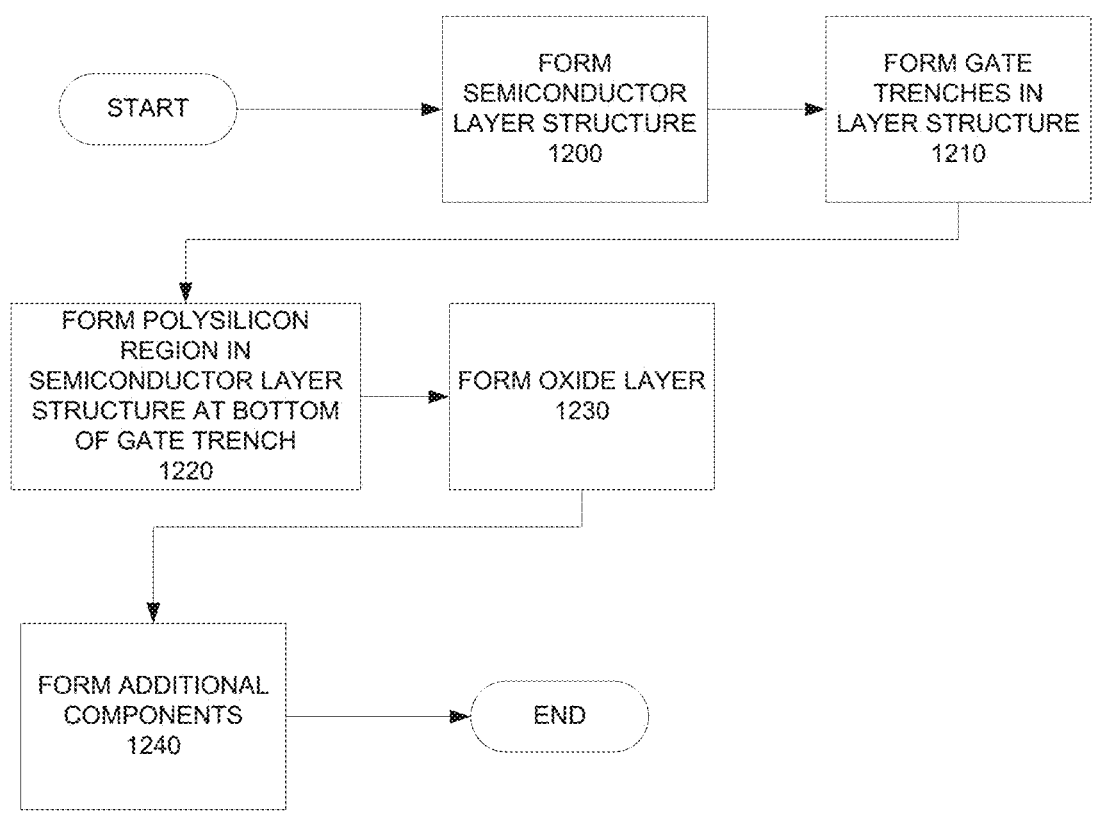

With reference to FIG. 12 and FIG. 7, operations may begin with formation of a wide band-gap semiconductor layer structure (Block 1200). The semiconductor layer structure may be formed in the same manner as described above with reference to Block 900 of FIG. 9, and hence further description thereof will be omitted. A plurality of gate trenches are formed in an upper surface of the semiconductor layer structure (Block 1210). The gate trenches may be formed in the same manner as described above with reference to Block 910 of FIG. 9, and hence further description thereof will be omitted. A polysilicon layer may be formed on the bottom (e.g., the second sidewall) of each gate trench (Block 1220). In some embodiments, the polysilicon layer may be deposited. The polysilicon layer and/or the one or more upper surfaces of the semiconductor layer structure may be oxidized or an oxide may be deposited, resulting in an oxide layer (Block 1230). Additional components, such as gate insulating layers, gate electrodes, and contacts may be formed on the top and bottom surfaces of the semiconductor layer structure to complete the device (Block 1240).

Figure 13:
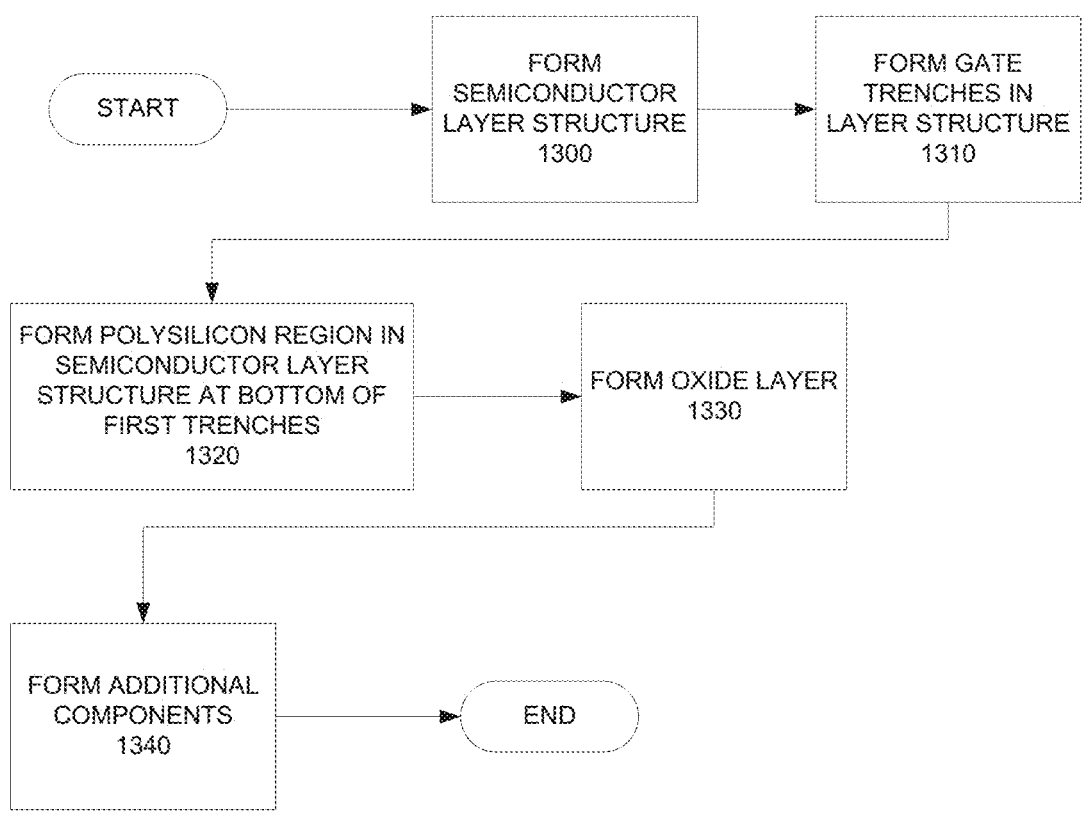

With reference to FIG. 13 and FIG. 8, operations may begin with formation of a wide band-gap semiconductor layer structure (Block 1300). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. In some embodiments, the semiconductor layer structure may include a current spreading layer that has the first conductivity type. A plurality of gate trenches are formed in an upper surface of the semiconductor layer structure (Block 1310). The gate trenches may extend in a first direction and may be spaced apart from each other in a second direction that is perpendicular to the first direction. Each gate trench may extend in length in a third direction that is perpendicular to the first direction. Each gate trench may have a bottom surface, a first sidewall that extends in the first direction and a second sidewall that extends in the first direction. The plurality of gate trenches may include first gate trenches and second gate trenches, which may alternate in the second direction. A polysilicon layer may be formed on the bottom (e.g., the second sidewall) of each first gate trench (Block 1320). In some embodiments, the polysilicon layer may be deposited. The polysilicon layer and/or the one or more upper surfaces of the semiconductor layer structure may be oxidized or an oxide may be deposited, resulting in an oxide layer (Block 1330). Additional components, such as gate insulating layers, gate electrodes, and contacts may be formed on the top and bottom surfaces of the semiconductor layer structure to complete the device (Block 1340). For example, gate electrodes may be formed in each second gate trench.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.). Herein, where a contact can be either a source contact or a drain contact it may be referred to as a "source/drain contact."

While the present invention is described above with respect to power MOSFET and power IGBT implementations, it will be appreciated that the techniques described herein apply equally well to other similar vertical power devices having a gate trench. Thus, embodiments of the present invention are not limited MOSFETs and IGBTs, and the techniques disclosed herein may be used on any appropriate gate trench device.

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

It will also be appreciated that the different features of the different embodiments described herein may be combined to provide additional embodiments. For example, it was discussed above with respect to one embodiment that junction termination extensions could be used in place of guard rings. This is true in each embodiment disclosed herein. Likewise, the shield regions under the gate trenches may be included or omitted in any of the embodiments. Any of the embodiments may also include well regions that have varying dopant concentrations including lower doped channel regions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A device comprising:
a wide band-gap semiconductor layer structure including a drift region that has a first conductivity type;
a plurality of trenches in an upper portion of the wide band-gap semiconductor layer structure, each trench having a bottom surface, a first sidewall, a second sidewall, and an upper opening, and the plurality of trenches comprising source trenches and gate trenches;
a polysilicon layer in a bottom of at least some of the source trenches and in direct contact with the drift region; and
a plurality of gate electrodes, each gate electrode arranged within a respective gate trench.

2. The device of claim 1, wherein each of the source trenches includes the polysilicon layer.

3. The device of claim 2, wherein each source trench extends in length in a direction parallel to an upper surface of the wide band-gap semiconductor layer structure, and wherein each polysilicon layer extends the length of the respective source trench.

4. The device of claim 1, wherein each source trench and each gate trench extends in length in a direction parallel to an upper surface of the wide band-gap semiconductor layer structure.

5. The device of claim 1, further comprising channel regions on the first sidewall of the gate trenches, wherein the wide band-gap semiconductor layer structure comprises well regions having a second conductivity type that is different from the first conductivity type, and wherein the channel regions are in the well regions.

6. The device of claim 1, wherein at least one gate trench has an oxide layer therein.

7. The device of claim 1, wherein the wide band-gap semiconductor layer structure comprises silicon carbide.

8. A device comprising:
a wide band-gap semiconductor layer structure including a drift region that has a first conductivity type;
a plurality of gate trenches in an upper portion of the wide band-gap semiconductor layer structure, each gate trench having a bottom surface, a first sidewall, a second sidewall, and an upper opening, each gate trench comprising a plurality of first length portions and a plurality of second length portions alternately arranged in a direction parallel to an upper surface of the wide band-gap semiconductor layer structure; and
a plurality of polysilicon layers, wherein each polysilicon layer is on both the first and second sidewalls of a respective first length portion of the plurality of gate trenches;
wherein the first and second sidewalls of the second length portions of the plurality of gate trenches are free from the polysilicon layers.

9. The device of claim 8, further comprising an oxide layer within each gate trench.

10. The device of claim 9, wherein the oxide layer comprises a first cross-section in the first length portions of each gate trench and a second cross-section in the second length portions of each gate trench.

11. The device of claim 8, further comprising a gate structure within respective gate trenches, wherein the gate structure comprises a gate electrode.

12. The device of claim 11, wherein the gate electrode comprises a first cross-section in the first length portions of each gate trench, and a second cross-section in the second length portions of each gate trench.

13. The device of claim 8, wherein the wide band-gap semiconductor layer structure comprises well regions having a second conductivity type that is different from the first conductivity type.

14. The device of claim 8, further comprising a first source/drain contact on a first major surface of the wide band-gap semiconductor layer structure and a second source/drain contact on a second major surface of the wide band-gap semiconductor layer structure opposite from the first major surface.

15. A device comprising:
a wide band-gap semiconductor layer structure including a drift region that has a first conductivity type, a well region that has a second conductivity type that is different from the first conductivity type, and a source region that has the first conductivity type;
a plurality of gate trenches in an upper portion of the wide band-gap semiconductor layer structure, each gate trench having a bottom surface, a first sidewall, a second sidewall, and an upper opening, and each gate trench exposing side surfaces of the drift region; and
a source contact that is electrically connected to the source region;
a plurality of polysilicon layers, each polysilicon layer on portions of at least one of the first and second sidewalls of a respective gate trench and having an upper surface above the wide band-gap semiconductor layer structure,
wherein the plurality of polysilicon layers are electrically connected to the source contact.

16. The device of claim 15, wherein each gate trench has first length portions and second length portions, and wherein each polysilicon layer covers an entirety of the second sidewall within a first of the second length portions of the respective gate trench.

17. The device of claim 16, wherein each polysilicon layer covers an entirety of the first sidewall within the first of the second length portions of the respective gate trench.

18. The device of claim 15, wherein each polysilicon layer extends longitudinally and covers portions of each of the first and second sidewalls along a length of the respective gate trench.

19. The device of claim 15, further comprising a gate structure within respective gate trenches, wherein the gate structure comprises a gate electrode.

* * * * *